(12) United States Patent
Yamauchi et al.

(10) Patent No.: US 8,339,830 B2
(45) Date of Patent: Dec. 25, 2012

(54) NONVOLATILE SEMICONDUCTOR STORAGE

(75) Inventors: Hideaki Yamauchi, Kanagawa (JP); Daichi Kaku, Kanagawa (JP); Takehiko Hojo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/233,320

(22) Filed: Sep. 15, 2011

(65) Prior Publication Data

US 2012/0243357 A1    Sep. 27, 2012

(30) Foreign Application Priority Data

Mar. 25, 2011 (JP) .................................. 2011-067502

(51) Int. Cl.
*G11C 17/00* (2006.01)
(52) U.S. Cl. .................... 365/96; 365/225.7; 365/200
(58) Field of Classification Search .................... 365/96, 365/225.7, 185.18, 185.09, 200
See application file for complete search history.

(56) References Cited

U.S. PATENT DOCUMENTS

| 7,345,903 B2* | 3/2008 | Nakano et al. .................. 365/96 |
| 7,382,680 B2* | 6/2008 | Nakano et al. ............. 365/233.1 |
| 2008/0062782 A1* | 3/2008 | Namekawa et al. .......... 365/195 |
| 2008/0080295 A1* | 4/2008 | Namekawa et al. ..... 365/230.06 |
| 2008/0094898 A1* | 4/2008 | Nakano et al. .......... 365/185.09 |
| 2010/0078699 A1* | 4/2010 | Nakano ........................ 257/298 |

FOREIGN PATENT DOCUMENTS

JP    2006-253353    9/2006

* cited by examiner

*Primary Examiner* — Gene Auduong
(74) *Attorney, Agent, or Firm* — Turocy & Watson, LLP

(57) ABSTRACT

According to one embodiment, a memory cell is configured using a field effect transistor and includes n anti-fuse elements, one ends of which are connected in common. A program voltage selection circuit selects, out of the n anti-fuse elements, an anti-fuse element to which a program voltage is applied. A sense amplifier is provided for the each memory cell and determines, based on data stored in the n anti-fuse elements, three or more values of readout levels.

20 Claims, 22 Drawing Sheets

NONVOLATILE SEMICONDUCTOR STORAGE

CROSS-REFERENCE TO RELATED APPLICATIONS

This application is based upon and claims the benefit of priority from the prior Japanese Patent Application No. 2011-67502, filed on Mar. 25, 2011; the entire contents of which are incorporated herein by reference.

FIELD

Embodiments described herein relate generally to a nonvolatile semiconductor storage.

BACKGROUND

In an anti-fuse element of a gate insulating film breakdown type, because data is written by breakdown of a gate insulating film of a transistor, it is necessary to feed a large current during the writing. Therefore, a writing transistor having a large size is necessary. This causes an increase in a layout area when the capacity of a memory is extended.

DETAILED DESCRIPTION

In general, according to one embodiment, a nonvolatile semiconductor storage includes memory cells, an internal potential generating circuit, a program voltage selection circuit, a sense amplifier, a barrier transistor, and a selection transistor. Each of the memory cells is configured using a field effect transistor and includes n (n is an integer equal to or larger than 2) anti-fuse elements, one ends of which are connected in common. The internal potential generating circuit generates a program voltage for breaking down a gate insulating film of the field effect transistor. The program voltage selection circuit selects, out of the n anti-fuse elements, an anti-fuse element to which the program voltage is applied. The sense amplifier is provided for each of the memory cells and determines, based on data stored in the n anti-fuse elements, three or more readout levels. The barrier transistor is provided for each of the memory cells and protects the sense amplifier from the voltage for breaking down the gate insulating film. The selection transistor is provided for each of the memory cells and selects a memory cell to which the program voltage is applied.

Exemplary embodiments of a nonvolatile semiconductor storage will be explained below in detail with reference to the accompanying drawings. The present invention is not limited to the following embodiments.

First Embodiment

Figure 1:
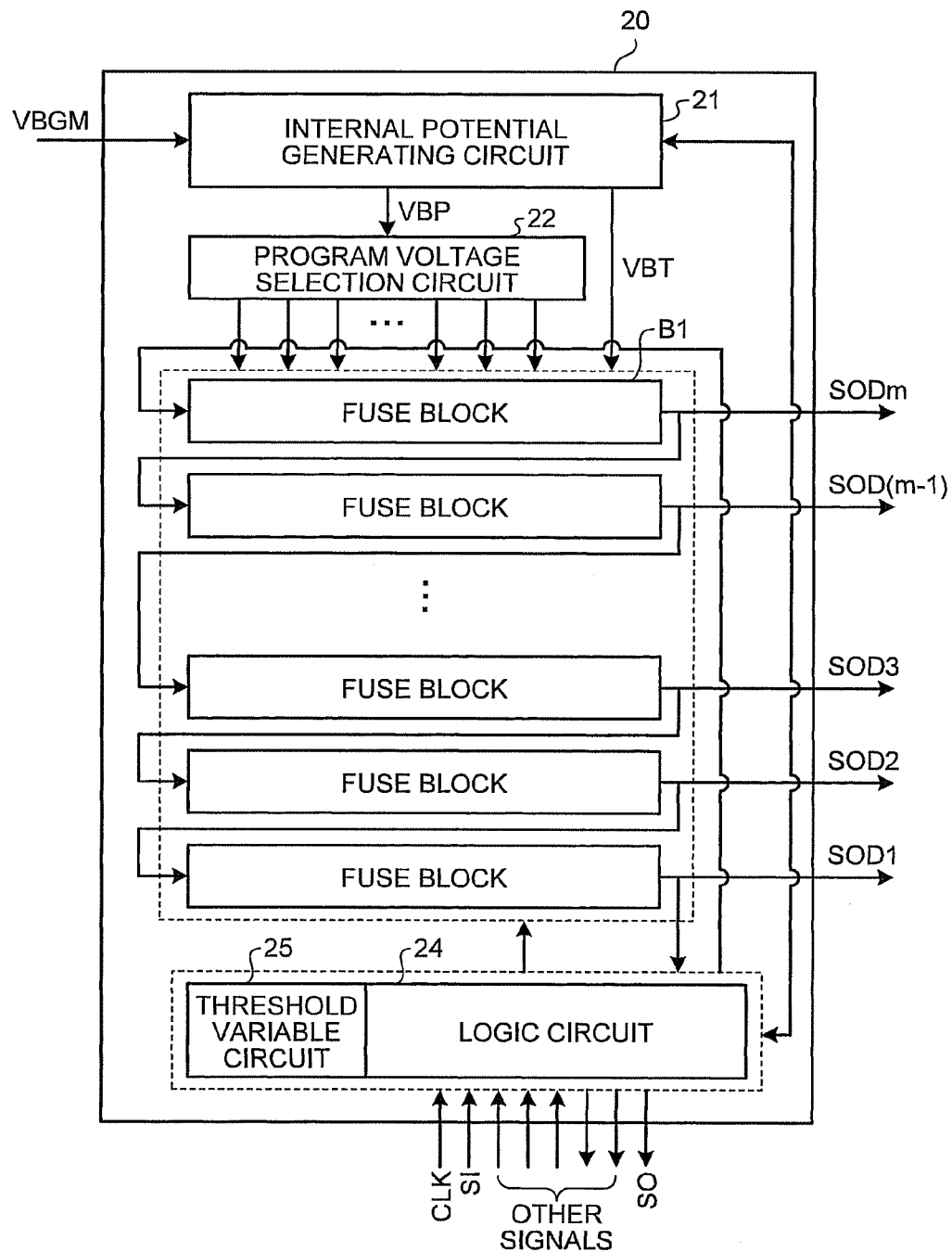
FIG. 1 is a block diagram of a schematic configuration of a nonvolatile semiconductor storage according to a first embodiment.

FIG. 1 is a block diagram of a schematic configuration of a nonvolatile semiconductor storage according to a first embodiment.

In FIG. 1, a fuse macro block 20 includes m (m is a positive integer) fuse blocks B1, an internal potential generating circuit 21, a program voltage selection circuit 22, a logic circuit 24, and a threshold variable circuit 25.

Each of the fuse blocks B1 includes a plurality of electrically-write-once memory cells. For example, data for 128 bits can be stored in one block. M stages of the fuse blocks B1 are connected. Readout data SOD1 to SODm are respectively extracted from the fuse blocks B1.

Figure 2:
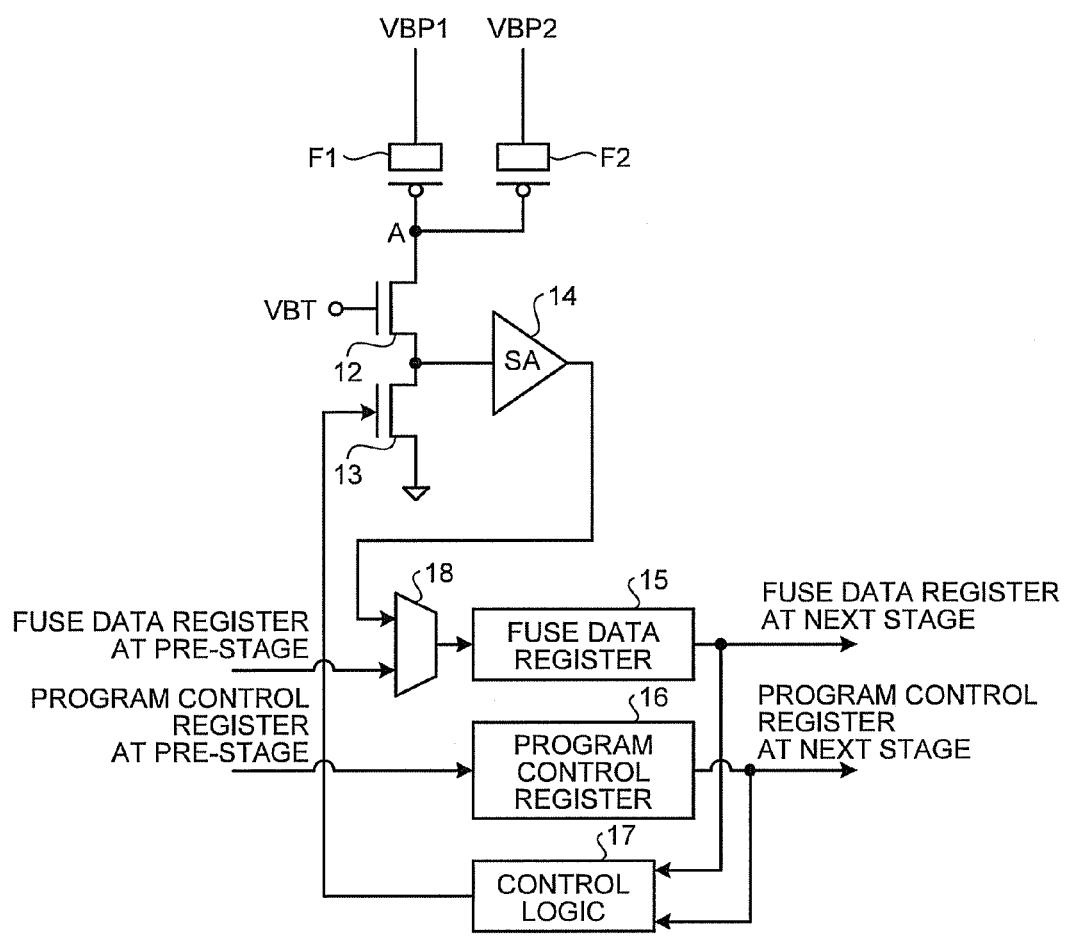
FIG. 2 is a block diagram of a schematic configuration of a memory cell applied to the nonvolatile semiconductor storage shown in FIG. 1.

FIG. 2 is a block diagram of a schematic configuration of a memory cell applied to the nonvolatile semiconductor storage shown in FIG. 1.

In FIG. 2, the memory cell includes two anti-fuse elements F1 and F2, a barrier transistor 12, a selection transistor 13, a sense amplifier 14, a fuse data register 15, a program control register 16, a control logic 17, and a selector 18. The anti-fuse elements F1 and F2 can be configured using field effect transistors. Sources, drains, and wells of the field effect transistors are connected in common. Gates of the field effect transistors of the anti-fuse elements F1 and F2 are connected to each other. Therefore, one ends of the anti-fuse elements F1 and F2 are connected to a node A in common.

The barrier transistor 12 can protect the sense amplifier 14 from a voltage for breaking down gate insulating films of the anti-fuse elements F1 and F2. The selection transistor 13 can select a memory cell in which gate insulating films of field effect transistors are broken down. The sense amplifier 14 can determine, based on data stored in the anti-fuse elements F1 and F2, three or more readout levels. When readout characteristics of the anti-fuse elements F1 and F2 are equal, three levels can be stored in one memory cell. When readout characteristics of the anti-fuse elements F1 and F2 are different from each other, four levels can be stored in one memory cell. A method of making the readout characteristics of the anti-fuse elements F1 and F2 different from each other can be realized by making transistor sizes or silicide densities of gate electrodes different from each other.

The fuse data register 15 can store data read out from the anti-fuse elements F1 and F2. The program control register 16 can store program control information for performing control during programming. The control logic 17 can control the operation of the selection transistor 13 during the programming. The selector 18 can select data of the anti-fuse elements F1 and F2 read out by the sense amplifier 14 or data stored in a fuse data register at a pre-stage and output the data to the fuse data register 15 at the own stage.

Gates of the field effect transistors of the anti-fuse elements F1 and F2 are connected to a drain of the barrier transistor 12. A source of the barrier transistor 12 is connected to a drain of the selection transistor 13 and an input terminal of the sense amplifier 14. An output terminal of the sense amplifier 14 is connected to one input terminal of the selector 18. The other input terminal of the selector 18 is connected to an output terminal of the fuse data register at the pre-stage. An output terminal of the selector 18 is connected to an input terminal of the fuse data register 15. An output terminal of the fuse data register 15 is connected to an input terminal of a fuse data register at the next stage and one input terminal of the control logic 17. An input terminal of the program control register 16 is connected to a program control register at the pre-stage. An output terminal of the program control register 16 is connected to an input terminal of a program control register at the next stage and the other input terminal of the control logic 17. An output terminal of the control logic 17 is connected to a gate of the selection transistor 13.

The fuse block B1 is configured by serially connecting such memory cells over a plurality of stages.

In FIG. 1, the internal potential generating circuit 21 can generate program voltages VBP1 and VBP2 respectively applied to the anti-fuse elements F1 and F2 shown in FIG. 2 and a barrier voltage VET applied to the barrier transistor 12. The program voltage selection circuit 22 can select, out of the anti-fuse elements F1 and F2, the anti-fuse elements F1 and F2 to which the program voltages VBP1 and VBP2 for breaking down the gate insulating films of the field effect transistors are applied. The logic circuit 24 can serially input program data SI to the fuse blocks B1 in synchronization with a clock signal CLX and serially output data SO read out from the fuse blocks B1. The threshold variable circuit 25 can change a threshold of the sense amplifier 14 according to the three or more readout levels of the memory cell.

In such a fuse macro block 20, because the sensor amplifier 14 shown in FIG. 2 is provided for each of the memory cells, it is possible to facilitate design of a storage that stably operates under a wide range of conditions.

Figure 3:
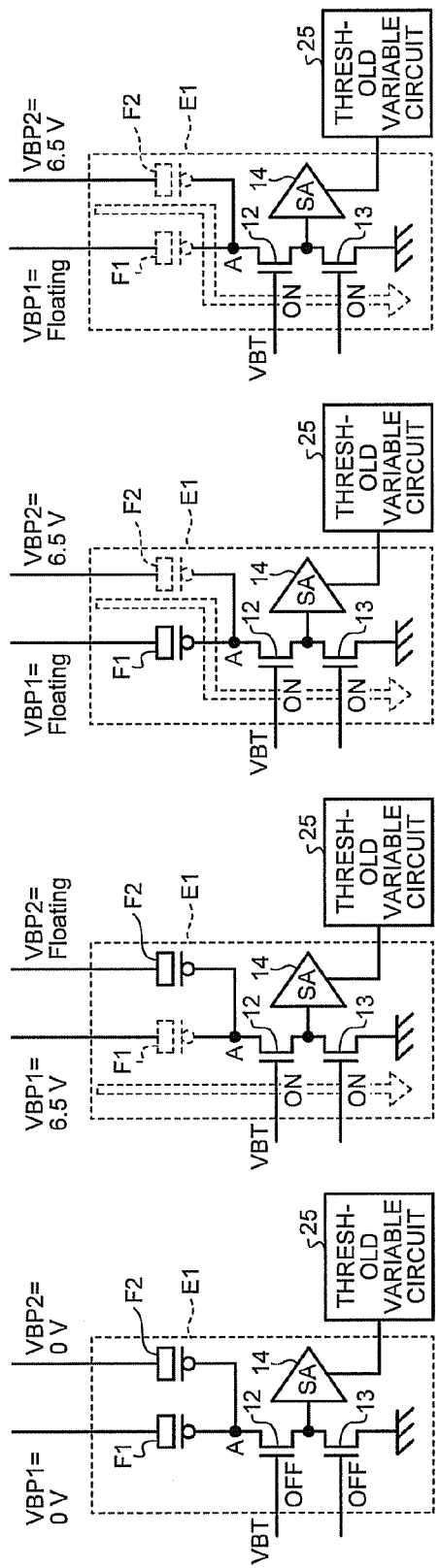
FIG. 3A is a block diagram of an initial state for one cell of the nonvolatile semiconductor storage shown in FIG. 1.
FIG. 3B is a block diagram of a writing operation of an anti-fuse element F1 shown in FIG. 3A.
FIG. 3C is a block diagram of a writing operation of an anti-fuse element F2 shown in FIG. 3A.
FIG. 3D is a block diagram of writing operations of the anti-fuse elements F1 and F2 shown in FIG. 3A.
Figure 4:
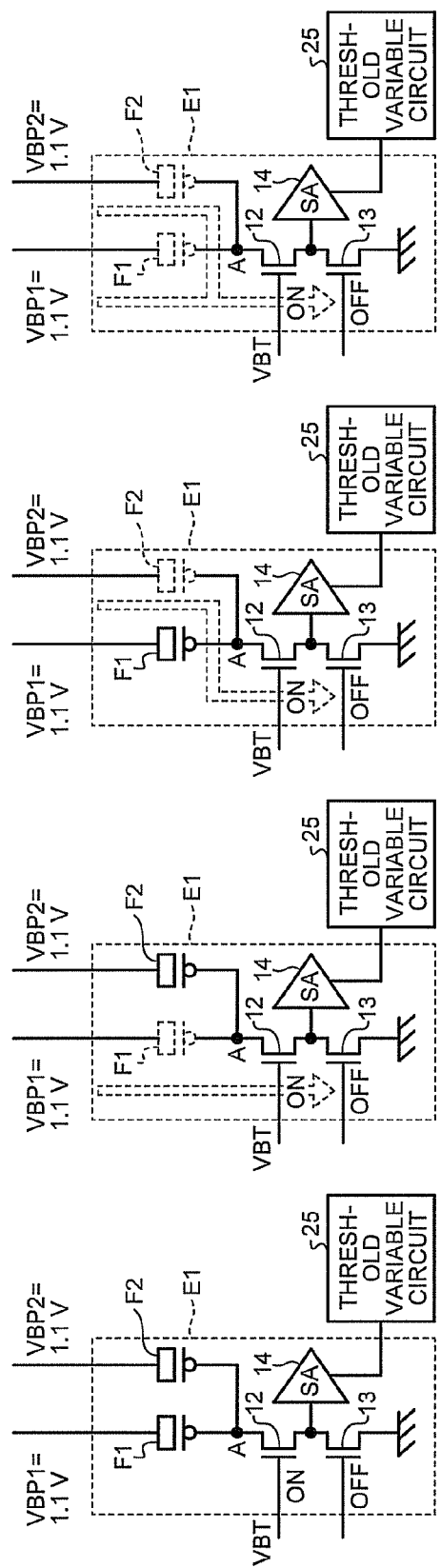
FIGS. 4A to 4D are block diagrams of readout operations respectively corresponding to states shown in FIGS. 3A to 3D.

FIG. 3A is a block diagram of an initial state for one cell of the nonvolatile semiconductor storage shown in FIG. 1. FIG. 3B is a block diagram of a writing operation of an anti-fuse element F1 shown in FIG. 3A. FIG. 3C is a block diagram of a writing operation of an anti-fuse element F2 shown in FIG. 3A. FIG. 3D is a block diagram of writing operations of the anti-fuse elements F1 and F2 shown in FIG. 3A. In the following explanation, as an example, a memory cell E1 is four level cell.

In FIG. 3A, the memory cell E1 includes the anti-fuse elements F1 and F2, the barrier transistor 12, the selection transistor 13, and the sense amplifier 14. Before the gate insulating films of the field effect transistors of the anti-fuse elements F1 and F2 are broken down, data '00' is stored in the memory cell E1. At this point, the program voltages VBP1 and VBP2 respectively applied to the anti-fuse elements F1 and F2 can be set to 0 volt.

When data '10' is written in the memory cell E1 as shown in FIG. 3B, program control information is transferred to the program control register 16 at the own stage via a serially-connected program control register.

The program voltage VBP1 of the anti-fuse element F1 is set to a high voltage of about 6.5 volts. The program voltage VBP2 of the anti-fuse element F2 is set in a floating state. The barrier voltage VBT is applied to a gate of the barrier transistor 12 and the barrier transistor 12 is turned on. At this point, a gate side of the anti-fuse elements F1 and F2 is charged in advance to potential low enough not to break down the gate insulating films of the field effect transistors of the anti-fuse elements F1 and F2.

The control logic 17 determines, based on the data of the anti-fuse elements F1 and F2 stored in the fuse data register 15 and the program control information stored in the program control register 16, timing when the control logic 17 performs a programming operation. In performing programming, the control logic 17 sets the potential of the gate of the selection transistor 13 to a high level and turns on the selection transistor 13 to lower the potential of the gates of the anti-fuse elements F1 and F2 to low potential VSS. As a result, a high voltage enough to break down the gate insulating film is applied to the gate insulating film of the field effect transistor of the anti-fuse element F1 and the gate insulating film is broken down. Therefore, the data '10' is written in the memory cell E1.

When the data '10' is written in the memory cell E1, the control logic 17 turns off the selection transistor 13 and stops the high voltage from being applied to the anti-fuse element F1.

When data '01' is written in the memory cell E1 as shown in FIG. 3C, the program control information is transferred to the program control register 16 at the own stage via the serially-connected program control register.

The program voltage VBP2 of the anti-fuse element F2 is set to a high voltage of about 6.5 volts. The program voltage VBP1 of the anti-fuse element F1 is set in a floating state. The barrier voltage VBT is applied to the gate of the barrier transistor 12 and the barrier transistor 12 is turned on. At this point, the gate side of the anti-fuse elements F1 and F2 is charged in advance to potential low enough not to break down the gate insulating films of the field effect transistors of the anti-fuse elements F1 and F2.

The control logic 17 determines, based on the data of the anti-fuse elements F1 and F2 stored in the fuse data register 15 and the program control information stored in the program control register 16, timing when the control logic 17 performs a programming operation. In performing programming, the control logic 17 sets the potential of the gate of the selection transistor 13 to the high level and turns on the selection transistor 13 to lower the potential of the gates of the anti-fuse elements F1 and F2 to the low potential VSS. As a result, a high voltage enough to break down the gate insulating film is applied to the gate insulating film of the field effect transistor of the anti-fuse element F2 and the gate insulating film is broken down. Therefore, the data '01' is written in the memory cell E1.

When data '11' is written in the memory cell E1 as shown in FIG. 3D, after the gate insulating film of the field effect transistor of the anti-fuse element F1 is broken down as shown in FIG. 3B, the gate insulating film of the field effect transistor of the anti-fuse element F2 can be broken down as shown in FIG. 3C.

FIGS. 4A to 4D are block diagrams of readout operations respectively corresponding to states shown in FIGS. 3A to 3D.

In FIGS. 4A to 4D, when data is read out from the memory cell E1, the program voltages VBP1 and VBP2 and the barrier voltage VBT are set to voltages suitable for the readout. For example, the program voltages VBP1 and VBP2 are set to a voltage of about 1.1 volts and the barrier voltage VBT is set to a voltage about twice as high as a power supply voltage VDD. At this point, the selection transistor 13 is turned off.

A threshold of the sense amplifier 14 is changed to three stages by the threshold variable circuit 25. Thresholds at this point are set as TH1<TH2<TH3. The input terminal of the sense amplifier 14 is once discharged to have the low potential VSS and then put on standby for a fixed time. In this period, when the data '00' is written in the memory cell E1, the potential of the input terminal of the sense amplifier 14 is maintained at the low potential VSS. On the other hand, when the data '01', '10', or '11' is written in the memory cell E1, the input terminal of the sense amplifier 14 is charged via the broken-down gate insulating films of the anti-fuse elements F1 and F2 and the potential of the input terminal of the sense amplifier 14 rises. In the sense amplifier 14, a difference between the potentials is compared with the threshold TH1. When the potential difference is equal to or lower than the threshold TH1, the data of the memory cell E1 is determined as '00'. When the potential difference exceeds the threshold TH1, the data of the memory cell E1 is determined as '01', '10', or '11' and latched to the sense amplifier 14 itself.

When the potential difference of the input terminal of the sense amplifier 14 exceeds the threshold TH1, readout of data from the memory cell E1 is further performed. The potential difference of the input terminal of the sense amplifier 14 is compared with the threshold TH2. When the potential difference is equal to or lower than the threshold TH2, the data of the memory cell E1 is determined as '01'. When the potential difference exceeds the threshold TH2, the data of the memory cell E1 is determined as '10' or '11' and latched to the sense amplifier 14 itself.

When the potential difference of the input terminal of the sense amplifier 14 exceeds the threshold TH2, readout of data from the memory cell E1 is further performed. The potential difference of the input terminal of the sense amplifier 14 is compared with the threshold TH3. When the potential difference is equal to or lower than the threshold TH3, the data of the memory cell E1 is determined as '10'. When the potential difference exceeds the threshold TH3, the data of the memory cell E1 is determined as '11' and latched to the sense amplifier 14 itself.

The data latched to the sense amplifier 14 is transferred to the fuse data register 15 and transferred to the outside via a serially-connected register chain.

Figure 5:
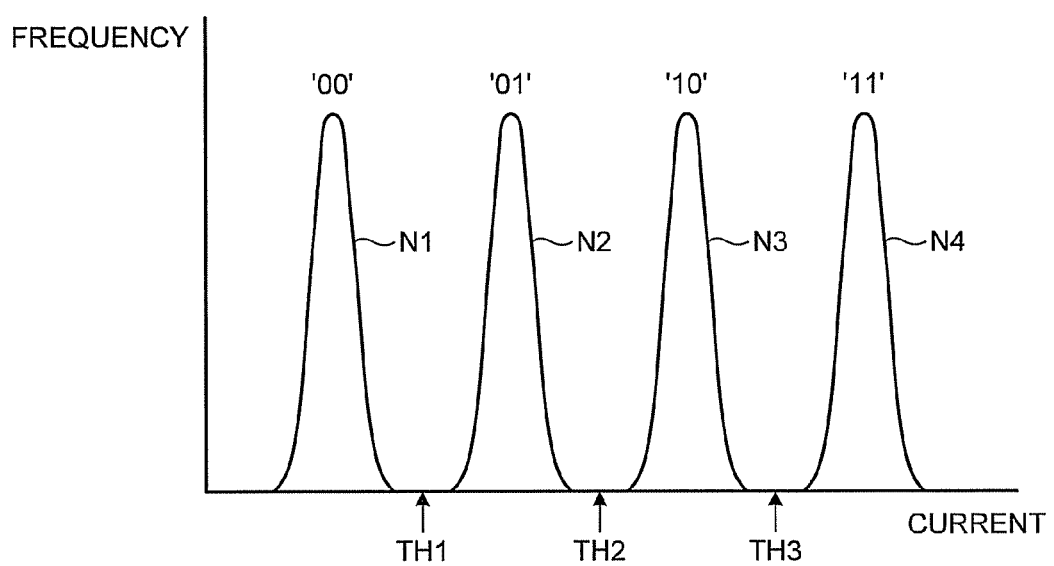
FIG. 5 is a diagram of readout current distributions corresponding to the states shown in FIGS. 3A to 3D.

FIG. 5 is a diagram of current distributions corresponding to the states shown in FIGS. 3A to 3D.

In FIG. 5, a current distribution at the time when the data '00' is stored in the memory cell E1 is represented as N1, a current distribution at the time when the data '01' is stored in the memory cell E1 is represented as N2. A current distribution at the time when the data '10' is stored in the memory cell E1 is represented as N3. A current distribution at the time when the data '11' is stored in the memory cell E1 is represented as N4. At this point, the threshold TH1 is set between the current distributions N1 and N2, the threshold TH2 is set between the current distributions N2 and N3, and the threshold TH3 is set between the current distributions N3 and N4.

Consequently, it is possible to determine which of the data '00', '01', '10', and '11' is stored in the memory cell E1 and it is possible to multinarize the memory cell E1. Therefore, it is unnecessary to provide the barrier transistor 12 and the selection transistor 13 for each one bit. It is possible to reduce a total number of barrier transistors 12 and selection transistors 13 per unit capacity. Therefore, it is possible to reduce a layout area.

Second Embodiment

Figure 6:
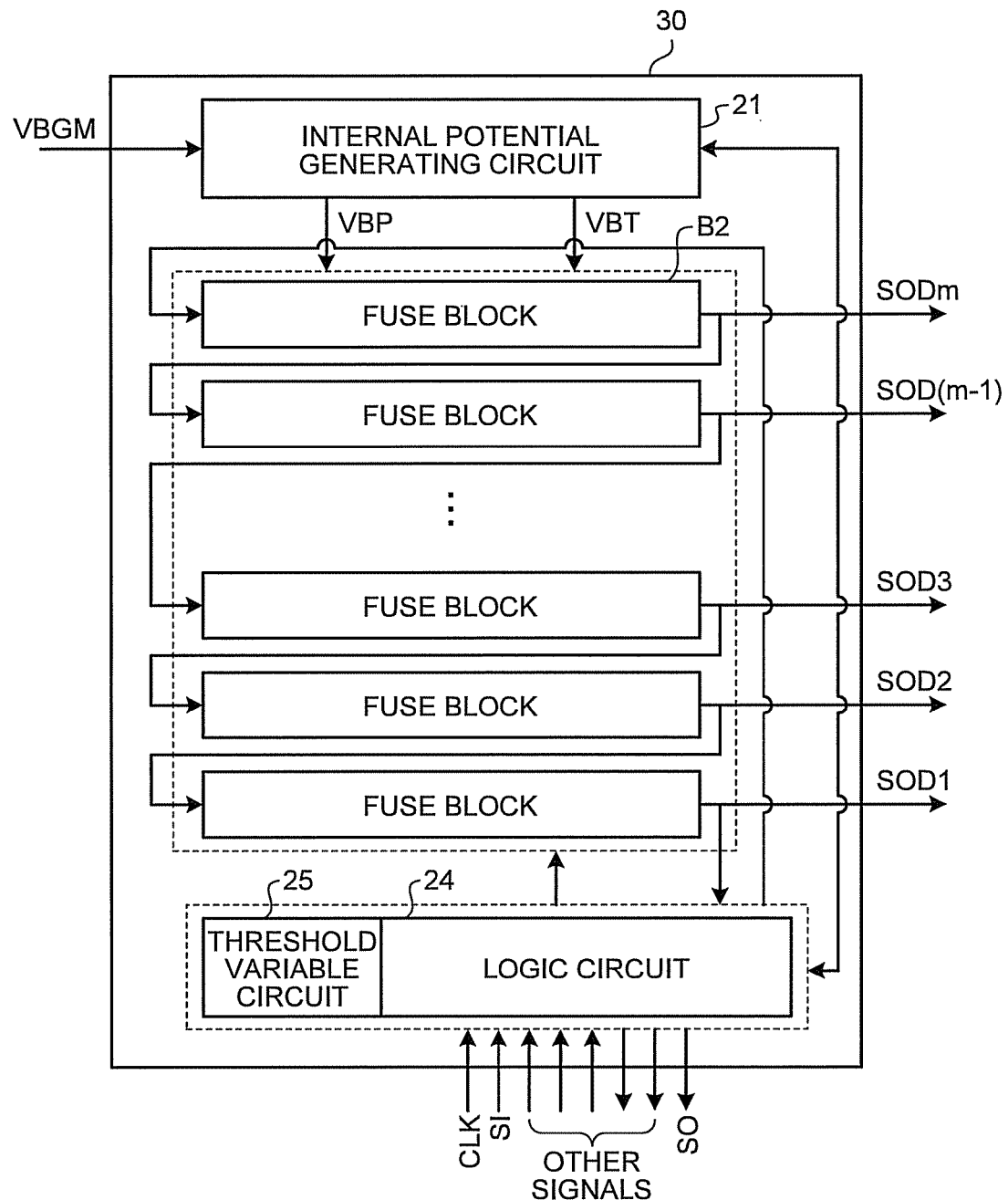
FIG. 6 is a block diagram of a schematic configuration of a nonvolatile semiconductor storage according to a second embodiment.

FIG. 6 is a block diagram of a schematic configuration of a nonvolatile semiconductor storage according to a second embodiment.

In FIG. 6, a fuse macro block 30 includes fuse blocks B2 instead of the fuse blocks B1 and the program voltage selection circuit 22 of the fuse macro block 20 shown in FIG. 1. Each of the fuse blocks B2 includes a memory cell E2 shown in FIG. 7A instead of the memory cell E1 shown in FIG. 3A.

Figure 7:
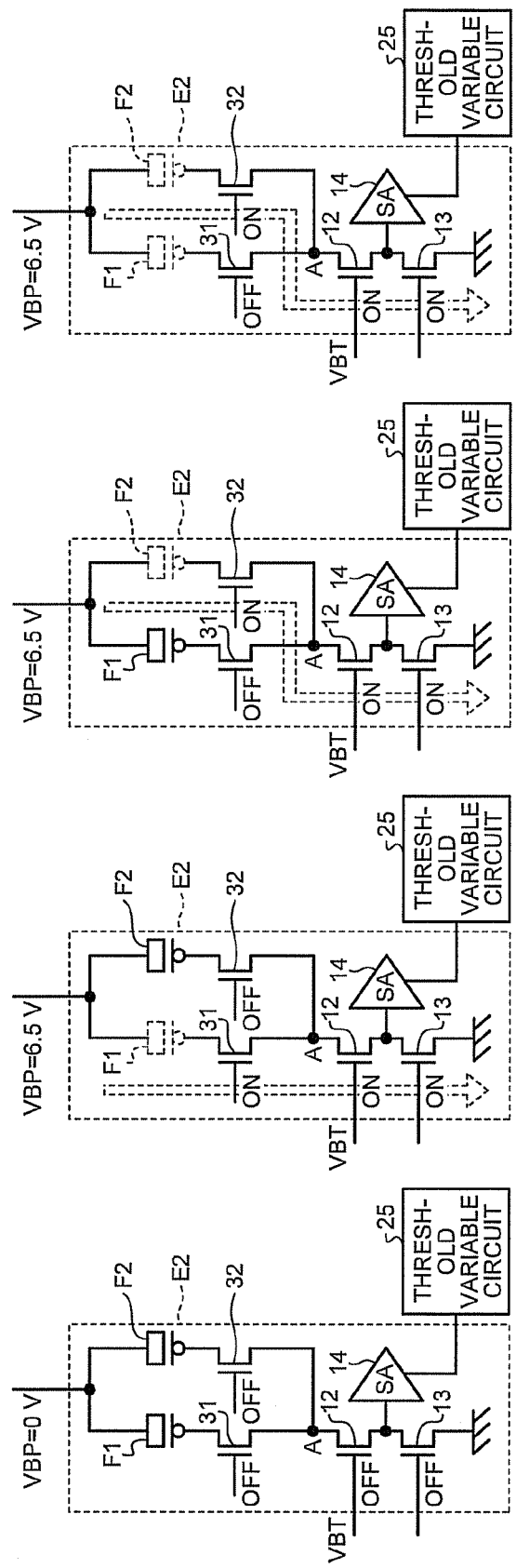
FIG. 7A is a block diagram of an initial state for one cell of the nonvolatile semiconductor storage shown in FIG. 6.
FIG. 7B is a block diagram of a writing operation of the anti-fuse element F1 shown in FIG. 7A.
FIG. 7C is a block diagram of a writing operation of the anti-fuse element F2 shown in FIG. 7A.
FIG. 7D is a block diagram of writing operations of the anti-fuse elements F1 and F2 shown in FIG. 7A.
Figure 8:
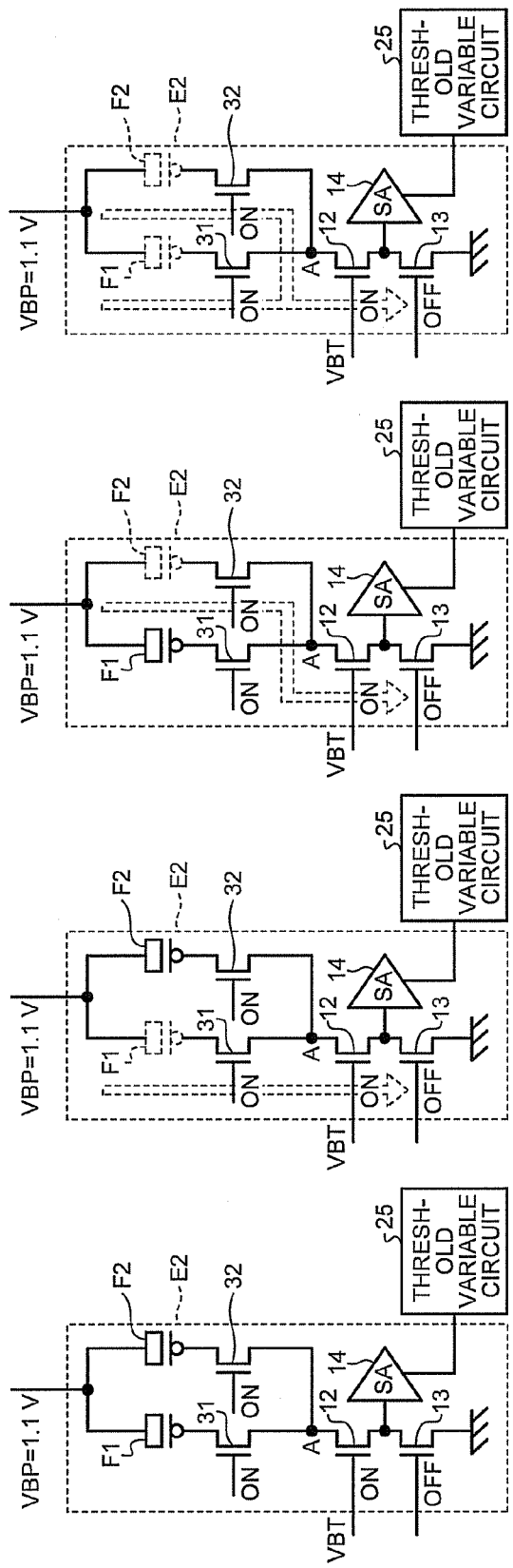
FIGS. 8A to 8D are block diagrams of readout operations respectively corresponding to states shown in FIGS. 7A to 7D.

FIG. 7A is a block diagram of an initial state for one cell of the nonvolatile semiconductor storage shown in FIG. 6. FIG. 7B is a block diagram of a writing operation of the anti-fuse element F1 shown in FIG. 7A. FIG. 7C is a block diagram of a writing operation of the anti-fuse element F2 shown in FIG. 7A. FIG. 7D is a block diagram of writing operations of the anti-fuse elements F1 and F2 shown in FIG. 7A.

In FIG. 7A, in the memory cell E2, switching transistors 31 and 32 are added to the memory cell E1 shown in FIG. 3A. The switching transistor 31 is connected to the anti-fuse element F1 in series. The switching transistor 32 is connected to the anti-fuse element F2 in series. One ends of the anti-fuse elements F1 and F2 are connected to the node A in common respectively via the switching transistors 31 and 32. The other ends of the anti-fuse elements F1 and F2 are also connected in common. The same program voltage VBP is applied to the anti-fuse elements F1 and F2.

Before the gate insulating films of the field effect transistors of the anti-fuse elements F1 and F2 are broken down, the switching transistors 31 and 32 are turned off and data '00' is stored in the memory cell E2. At this point, the program voltage VBP applied to the anti-fuse elements F1 and F2 can be set to 0 volt.

When data '10' is written in the memory cell E2 as shown in FIG. 7B, program control information is transferred to the program control register 16 at the own stage via a serially-connected program control register.

The program voltage VBP of the anti-fuse elements F1 and F2 is set to a high voltage of about 6.5 volts. The barrier voltage VBT is applied to the gate of the barrier transistor 12 and the barrier transistor 12 is turned on. The switching transistor 31 is turned on and the switching transistor 32 is turned off. At this point, a gate side of the anti-fuse elements F1 and F2 is charged in advance to potential low enough not to break down the gate insulating films of the field effect transistors of the anti-fuse elements F1 and F2.

The control logic 17 determines, based on the data of the anti-fuse elements F1 and F2 stored in the fuse data register 15 and the program control information stored in the program control register 16, timing when the control logic 17 performs a programming operation. In performing programming, the control logic 17 sets the potential of the gate of the selection transistor 13 to a high level and turns on the selection transistor 13 to lower the potential of the gate of the anti-fuse element F1 to the low potential VSS. As a result, a high voltage enough to break down the gate insulating film is applied to the gate insulating film of the field effect transistor of the anti-fuse element F1 and the gate insulating film is broken down. Therefore, the data '10' is written in the memory cell E2.

When data '01' is written in the memory cell E2 as shown in FIG. 7C, the program control information is transferred to the program control register 16 at the own stage via the serially-connected program control register.

The program voltage VBP of the anti-fuse elements F1 and F2 is set to a high voltage of about 6.5 volts. The barrier voltage VBT is applied to the gate of the barrier transistor 12 and the barrier transistor 12 is turned on. The switching transistor 31 is turned on and the switching transistor 32 is turned off. At this point, a gate side of the anti-fuse elements F1 and F2 is charged in advance to potential low enough not to break down the gate insulating films of the field effect transistors of the anti-fuse elements F1 and F2.

The control logic 17 determines, based on the data of the anti-fuse elements F1 and F2 stored in the fuse data register 15 and the program control information stored in the program control register 16, timing when the control logic 17 performs a programming operation. In performing programming, the control logic 17 sets the potential of the gate of the selection transistor 13 to a high level and turns on the selection transistor 13 to lower the potential of the gate of the anti-fuse element F2 to the low potential VSS. As a result, a high voltage enough to break down the gate insulating film is applied to the gate insulating film of the field effect transistor of the anti-fuse element F2 and the gate insulating film is broken down. Therefore, the data '01' is written in the memory cell E2.

When data '11' is written in the memory cell E2 as shown in FIG. 7D, after the gate insulating film of the field effect transistor of the anti-fuse element F1 is broken down as shown in FIG. 7B, the gate insulating film of the field effect transistor of the anti-fuse element F2 can be broken down as shown in FIG. 7C.

FIGS. 8A to 8D are block diagrams of readout operations respectively corresponding to states shown in FIGS. 7A to 7D.

In FIGS. 8A to 8D, when data is read out from the memory cell E2, the program voltage VBP and the barrier voltage VBT are set to voltages suitable for readout. For example, the program voltage VBP is set to a voltage of about 1.1 volts and the barrier voltage VBT is set to a voltage about twice as high as the power supply voltage VDD. At this point, the selection transistor 13 is turned off and the switching transistors 31 and 32 are turned on.

A threshold of the sense amplifier 14 is changed to three stages by the threshold variable circuit 25. The input terminal of the sense amplifier 14 is once discharged to have the low potential VSS and then put on standby for a fixed time. In this period, when the data '00' is written in the memory cell E2, the potential of the input terminal of the sense amplifier 14 is maintained at the low potential VSS. On the other hand, when the data '01', '10', or '11' is written in the memory cell E2, the input terminal of the sense amplifier 14 is charged via the broken-down gate insulating films of the fuse elements F1 and F2 and the potential of the input terminal of the sense amplifier 14 rises. In the sense amplifier 14, a difference between the potentials is compared with the threshold TH1. When the potential difference is equal to or lower than the threshold TH1, the data of the memory cell E2 is determined as '00'. When the potential difference exceeds the threshold TH1, the data of the memory cell E2 is determined as '01', '10', or '11' and latched to the sense amplifier 14 itself.

When the potential difference of the input terminal of the sense amplifier 14 exceeds the threshold TH1, readout of data from the memory cell E1 is further performed. The potential difference of the input terminal of the sense amplifier 14 is compared with the threshold TH2. When the potential difference is equal to or lower than the threshold TH2, the data of the memory cell E2 is determined as '01'. When the potential difference exceeds the threshold TH2, the data of the memory cell E2 is determined as '10' or '11' and latched to the sense amplifier 14 itself.

When the potential difference of the input terminal of the sense amplifier 14 exceeds the threshold TH2, readout of data from the memory cell E2 is further performed. The potential difference of the input terminal of the sense amplifier 14 is compared with the threshold TH3. When the potential difference is equal to or lower than the threshold TH3, the data of the memory cell E2 is determined as '10'. When the potential difference exceeds the threshold TH3, the data of the memory cell E2 is determined as '11' and latched to the sense amplifier 14 itself.

The data latched to the sense amplifier 14 is transferred to the fuse data register 15 and transferred to the outside via a serially-connected register chain.

Third Embodiment

Figure 9:
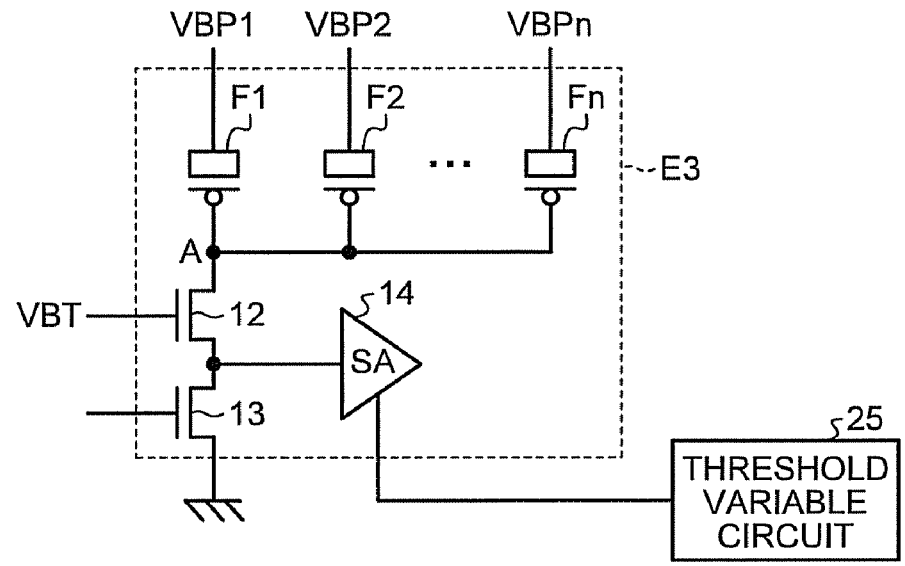
FIG. 9 is a block diagram of a schematic configuration for one cell of a nonvolatile semiconductor storage according to a third embodiment.

FIG. 9 is a block diagram of a schematic configuration for one cell of a nonvolatile semiconductor storage according to a third embodiment.

In FIG. 9, the nonvolatile semiconductor storage includes a memory cell E3 instead of the memory cell E1 shown in FIG. 3A. The memory cell E3 includes n anti-fuse elements F1 to Fn instead of the anti-fuse elements F1 and F2 shown in FIG. 3A. The anti-fuse elements F1 to Fn can be configured using field effect transistors. Sources, drains, and wells of the field effect transistors are connected in common. Gates of the field effect transistors of the anti-fuse elements F1 to Fn are connected to one another. Therefore, one ends of the anti-fuse elements F1 to Fn are connected to the node A in common.

Driving forces of the field effect transistors of the anti-fuse elements F2 to Fn can be respectively set to $2^2$ to $2^n$ of driving force of the field effect transistor of the anti-fuse element F1. The threshold variable circuit 25 can change a threshold of the sense amplifier 14 to $(2^n-1)$ stages.

Consequently, the memory cell E3 can be $2^n$-arized. It is possible to reduce a total number of barrier transistors 12 and selection transistors 13 per unit capacity. Therefore, it is possible to reduce a layout area.

Fourth Embodiment

Figure 10:
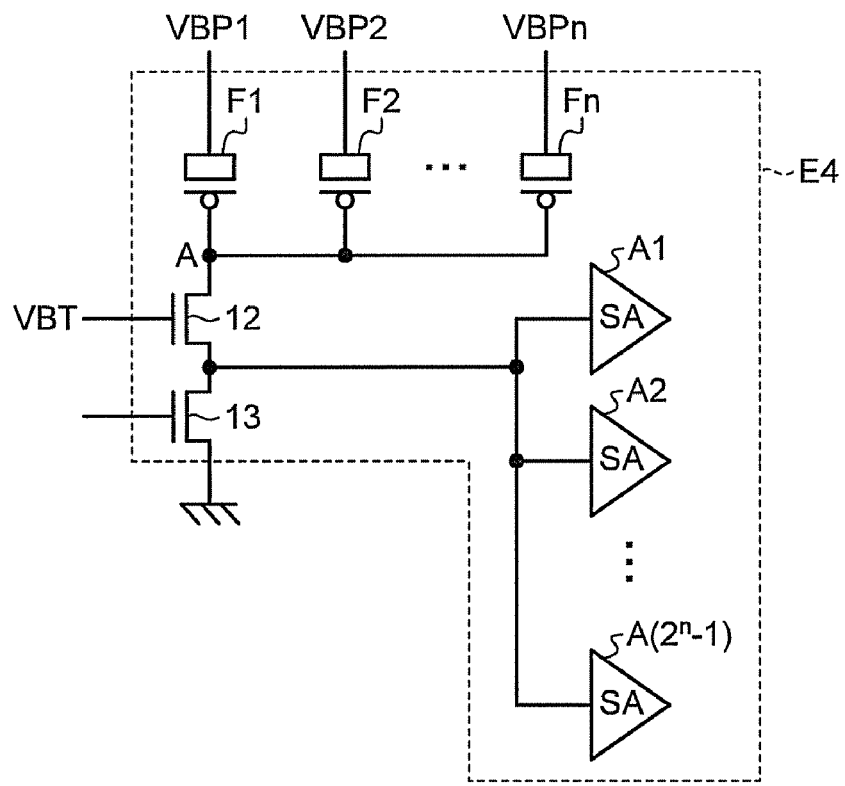
FIG. 10 is a block diagram of a schematic configuration for one cell of a nonvolatile semiconductor storage according to a fourth embodiment.

FIG. 10 is a block diagram of a schematic configuration for one cell of a nonvolatile semiconductor storage according to a fourth embodiment.

In FIG. 10, the nonvolatile semiconductor storage includes a memory cell E4 instead of the memory cell E3 shown in FIG. 9. The memory cell E4 includes $2^n-1$ sense amplifiers A1 to $A(2^n-1)$ instead of the sense amplifier 14 shown in FIG. 9. A threshold of the sense amplifiers A1 to $A(2^n-1)$ can be changed to $(2^n-1)$ stages.

The sense amplifiers A1 to $A(2^n-1)$ can simultaneously compare potential differences of input terminals thereof and thresholds. Consequently, the memory cell E4 can be $2^n$-arized. It is possible to reduce a layout area. It is unnecessary to repeatedly perform readout from the memory cell E4 to determine data stored in the memory cell E4. Therefore, it is possible to reduce readout time.

Fifth Embodiment

Figure 11:
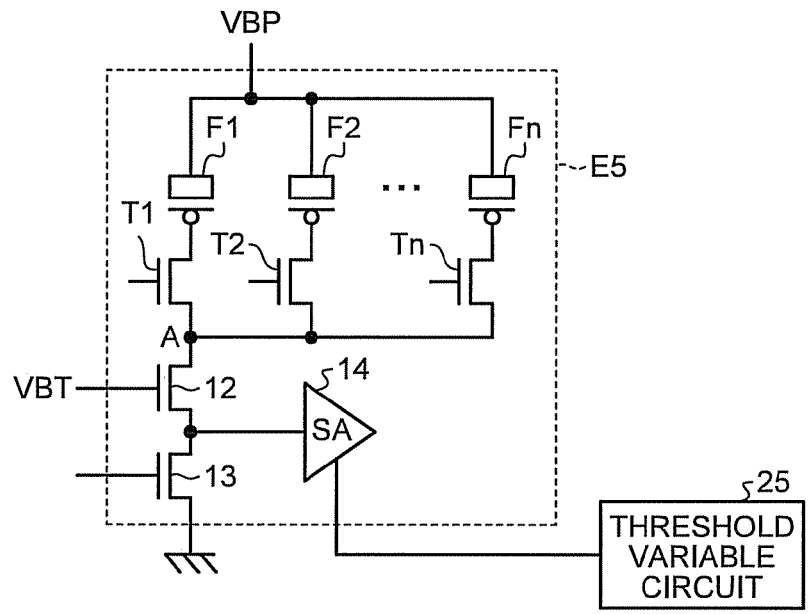
FIG. 11 is a block diagram of a schematic configuration for one cell of a nonvolatile semiconductor storage according to a fifth embodiment.

FIG. 11 is a block diagram of a schematic configuration for one cell of a nonvolatile semiconductor storage according to a fifth embodiment.

In FIG. 11, the nonvolatile semiconductor storage includes a memory cell E5 instead of the memory cell E2 shown in FIG. 7A. The memory cell E5 includes n anti-fuse elements F1 to Fn and n switching transistors T1 to Tn instead of the anti-fuse elements F1 and F2 and the switching transistors 31 and 32 shown in FIG. 7A. The switching transistors T1 to Tn are respectively connected to the anti-fuse elements F1 to Fn in series. One ends of the anti-fuse elements F1 to Fn are connected to the node A in common respectively via the switching transistors T1 to Tn. The other ends of the anti-fuse elements F1 to Fn are also connected in common. The same program voltage VBP is applied to the anti-fuse elements F1 to Fn.

Consequently, the memory cell E5 can be $2^n$-arized. It is possible to reduce a total number of barrier transistors 12 and selection transistors 13 per unit capacity. Therefore, it is possible to reduce a layout area.

Sixth Embodiment

Figure 12:
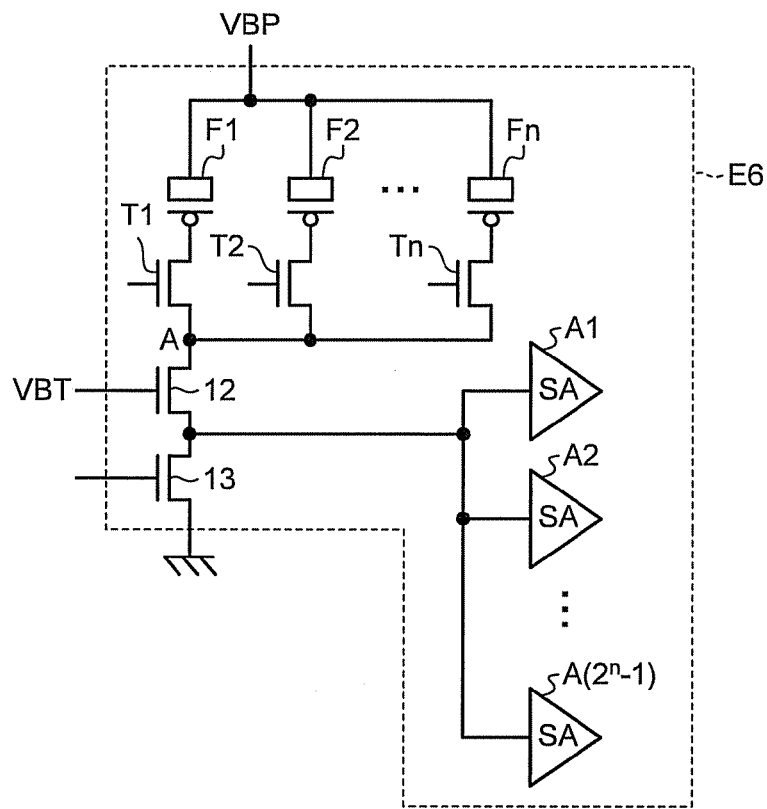
FIG. 12 is a block diagram of a schematic configuration for one cell of a nonvolatile semiconductor storage according to a sixth embodiment.

FIG. 12 is a block diagram of a schematic configuration for one cell of a nonvolatile semiconductor storage according to a sixth embodiment.

In FIG. 12, the nonvolatile semiconductor storage includes a memory cell E6 instead of the memory cell E5 shown in FIG. 11. The memory cell E6 includes $2^n-1$ sense amplifiers A1 to $A(2^n-1)$ instead of the sense amplifier 14 shown in FIG. 11. A threshold of the sense amplifiers A1 to $A(2^n-1)$ can be changed to $(2^n-1)$ stages.

The sense amplifiers A1 to $A(2^n-1)$ can simultaneously compare potential differences of input terminals thereof and thresholds. Consequently, the memory cell E6 can be $2^n$-arized. It is possible to reduce a layout area. It is unnecessary to repeatedly perform readout from the memory cell E6 to determine data stored in the memory cell E6. Therefore, it is possible to reduce readout time.

Seventh Embodiment

Figure 13:
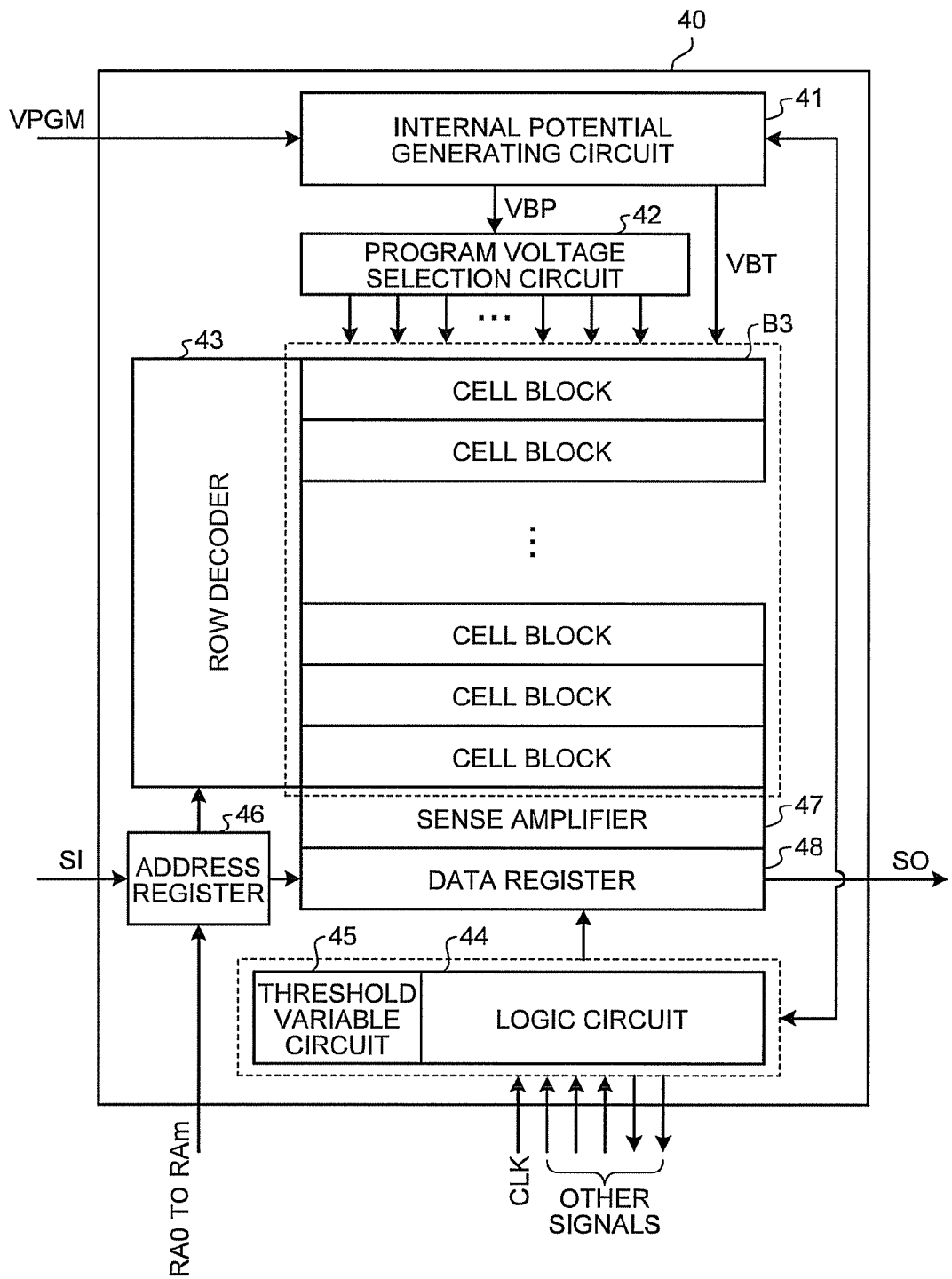
FIG. 13 is a block diagram of a schematic configuration of a nonvolatile semiconductor storage according to a seventh embodiment.

FIG. 13 is a block diagram of a schematic configuration of a nonvolatile semiconductor storage according to a seventh embodiment.

In FIG. 13, a fuse macro block 40 includes cell blocks B3, an internal potential generating circuit 41, a program voltage selection circuit 42, a row decoder 43, a logic circuit 44, a threshold variable circuit 45, an address register 46, a sense amplifier 47, and a data register 48.

Each of the cell blocks B3 includes electrically-write-once memory cells arranged in a row direction. The cell block 33 is arranged in a column direction. Therefore, the memory cells are arranged in a matrix shape in the row direction and the column direction. For example, data for 128 bits can be stored in one block.

Figure 14:
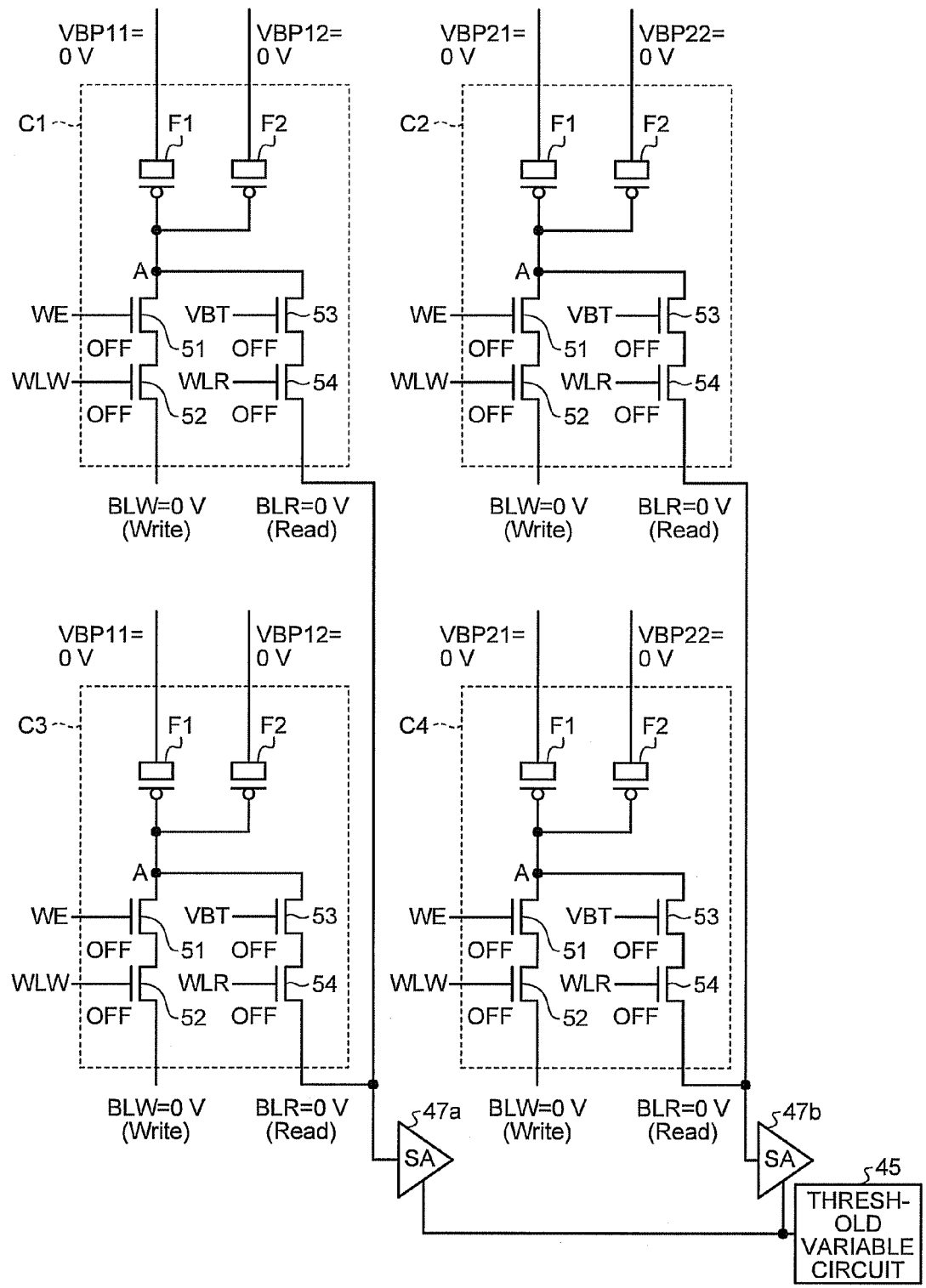
FIG. 14 is a block diagram of an initial state for four cells of the nonvolatile semiconductor storage shown in FIG. 13.

FIG. 14 is a block diagram of an initial state for four cells of the nonvolatile semiconductor storage shown in FIG. 13.

In FIG. 14, for example, four memory cells C1 to C4 are arranged in a matrix shape in the row direction and the column direction. Sense amplifiers 47a and 47b are provided in each column as the sense amplifier 47.

Each of the memory cells C1 to C4 includes two anti-fuse elements F1 and F2, a writing control transistor 51, a writing transistor 52, a readout barrier transistor 53, and a readout transistor 54. The anti-fuse elements F1 and F2 can be configured using field effect transistors. Sources, drains, and wells of the field effect transistors are connected in common. Gates of the field effect transistors of the anti-fuse elements F1 and F2 are connected to each other. Therefore, one ends of the anti-fuse elements F1 and F2 are connected to the node A in common. The writing transistor 52 and the writing control transistor 51 are connected to each other in series. The readout transistor 54 and the readout barrier transistor 53 are connected to each other in series.

One ends of the anti-fuse elements F1 and F2 are connected to a drain of the writing transistor 52 via the writing control transistor 51 and connected to a drain of the readout transistor 54 via the read out barrier transistor 53.

A writing control signal WE is input to gates of the writing control transistors 51 of the memory cells C1 to C4. The barrier voltage VBT is input to gates of the readout barrier transistors 53 of the memory cells C1 to C4. Gates of the writing transistors 52 of the memory cells C1 to C4 are connected to a writing word line WLW for each row. Sources of the writing transistors 52 of the memory cells C1 to C4 are connected to a writing bit line BLW for each column. Gates of the readout transistors 54 of the memory cells C1 to C4 are connected to a readout word line WLR for each row. Sources of the readout transistors 54 of the memory cells C1 to C4 are connected to a readout bit line BLR for each column. The sense amplifiers 47a and 47b are connected to the readout bit line BLR for each column.

Before the gate insulating films of the field effect transistors of the anti-fuse elements F1 and F2 re broken down, data '00' is stored in the memory cells C1 to C4. At this point, program voltages VBP11 and VBP12 respectively applied to the anti-fuse elements F1 and F2 of the memory cells C1 and C3 in the same column can be set to 0 volt. Program voltages VBP21 and VBP22 respectively applied to the anti-fuse elements F1 and F2 of the memory cells C2 and C4 in the same column can be set to 0 volt.

In FIG. 13, the internal potential generating circuit 41 can generate, for example, the program voltages VBP11 and VBP12 respectively applied to the anti-fuse elements F1 and F2 shown in FIG. 14 and the barrier voltage VBT applied to the readout barrier transistor 53. The program voltage selection circuit 42 can select, out of the anti-fuse elements F1 and F2, the anti-fuse elements F1 and F2 to which the program voltages VBP11 and VBP12 for breaking down the gate insulating films of the field effect transistors are applied. The row decoder 43 can select the memory cells C1 to C4 for each row. The logic circuit 44 can input program data SI in synchronization with a clock signal CLK and output data SO read out from the memory cells C1 to C4. The threshold variable circuit 45 can change a threshold of the sense amplifier 47 according to three or more readout levels of a memory cell. The address register 46 can write data in addresses designated by row addresses RA0 to RAm and read out data from the addresses designated by the row addresses RA0 to RAm. The sense amplifier 47 can determine, based on data stored in the anti-fuse elements F1 and F2, three or more readout levels for each row. The data register 48 can store data detected by the sense amplifier 47.

Figure 15:
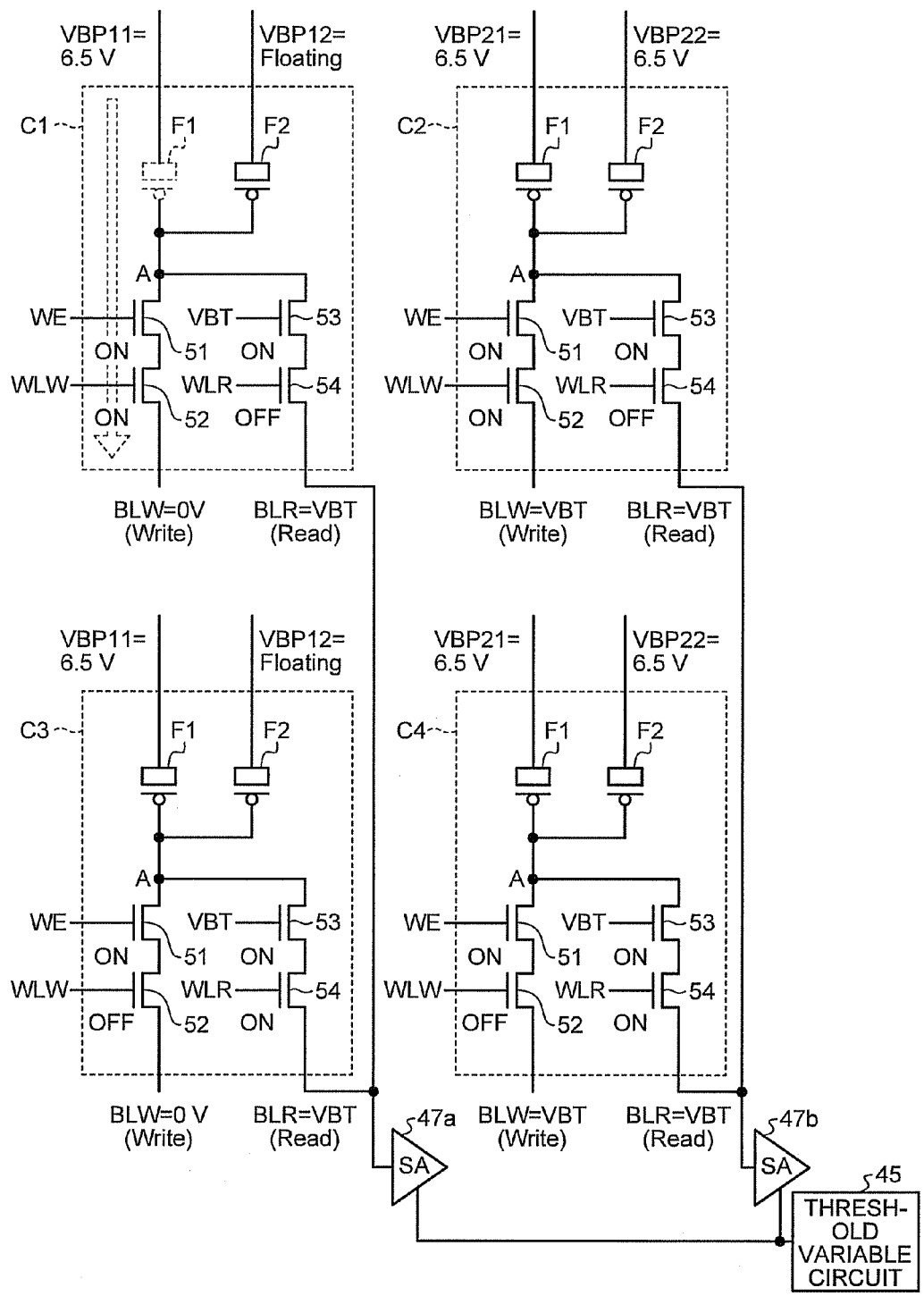
FIG. 15 is a block diagram of a writing operation of the anti-fuse element F1 of a memory cell C1 shown in FIG. 14.

FIG. 15 is a block diagram of a writing operation of the anti-fuse element F1 shown in FIG. 14.

In FIG. 15, when data '10' is written in the memory cell C1, the writing control signal WE is shifted from low level potential to high level potential and the writing control transistor 51 is turned on. The program voltage VBP11 of the anti-fuse element F1 in a selected column is set to a high voltage of about 6.5 volts. The program voltage VBP12 of the anti-fuse element F2 in the selected column is set in a floating state. The program voltages VBP21 and VBP22 of the anti-fuse elements F1 and F2 in an unselected column are set to a high voltage of about 6.5 volts. The barrier voltage VBT is applied to a gate of the readout barrier transistor 53 and the readout barrier transistor 53 is turned on. The barrier voltage VBT can be set to a voltage sufficient to turn on the readout barrier transistor 53 and can be set to, for example, about 4.2 volts. The potential of the writing bit line BLW in the selected column is set to 0 volt. The potential of the readout bit line BLR in the selected column is set to the barrier voltage VBT. The potential of the writing bit line BLW and the readout bit line BLR in the unselected column is set to the barrier voltage VBT.

When the row addresses RA0 to RAm are input to the row decoder 43, the potential of the writing word line WLW in a selected row rises and the writing transistor 52 in the selected row is turned on. As a result, a high voltage of about 6 volts is applied to the gate insulating film of the anti-fuse element F1 of the memory cell C1 and the gate insulating film is broken down. Therefore, data '10' is written in the memory cell C1.

By setting the potential of the readout bit line BLR to the barrier voltage VBT during writing, it is possible to prevent a high voltage of about 6 volt from being applied to the anti-fuse elements F1 and F2 of the memory cells C3 and C4 in an unselected row and prevent the gate insulating films of the anti-fuse elements F1 and F2 from being broken down. By setting the potential of the writing bit line BLW in the unselected column to the barrier voltage VBT during writing, it is possible to prevent a high voltage of about 6 volts from being applied to the anti-fuse elements F1 and F2 of the memory cell C2 in the selected row and the unselected column and prevent the gate insulating films of the anti-fuse elements F1 and F2 from being broken down.

Figure 16:
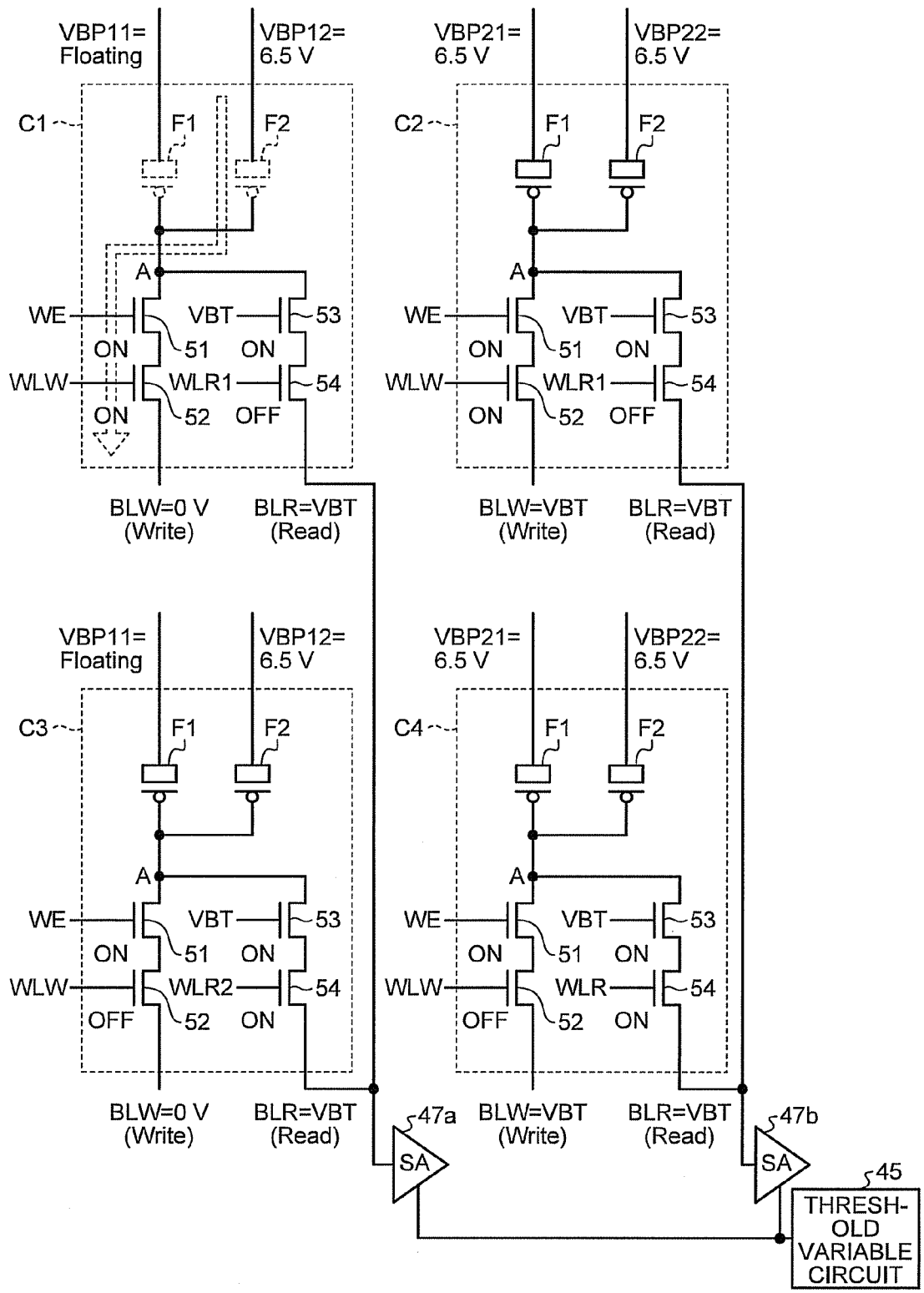
FIG. 16 is a block diagram of a writing operation of the anti-fuse element F2 of the memory cell C1 shown in FIG. 15.

FIG. 16 is a block diagram of a writing operation of the anti-fuse element F2 shown in FIG. 15.

In FIG. 16, when data '11' is written in the memory cell C1, as shown in FIG. 15, the gate insulating film of the anti-fuse element F1 of the memory cell C1 is broken down and then the gate insulating film of the anti-fuse element F2 of the memory cell C1 is broken down.

When the gate insulating film of the anti-fuse element F2 of the memory cell C1 is broken down, the writing control signal WE is shifted from low level potential to high level potential and the writing control transistor 51 is turned on. The program voltage VBP12 of the anti-fuse element F2 in the selected column is set to a high voltage of about 6.5 volts. The program voltage VBP11 of the anti-fuse element F1 in the selected column is set in a floating state. The program voltages VBP21 and VBP22 of the anti-fuse elements F1 and F2 in the unselected column is set to a high voltage of about 6.5 volts. The barrier voltage VBT is applied to the gate of the readout barrier transistor 53 and the readout barrier transistor 53 is turned on. The potential of the writing bit line BLW in the selected column is set to 0 volt. The potential of the readout bit line BLR in the selected column is set to the barrier voltage VBT. The potential of the writing bit line BLW and the readout bit line BLR in the unselected column is set to the barrier voltage VBT.

When the row addresses RA0 to RAm are input to the row decoder 43, the potential of the writing word line WLW in the selected row rises and the writing transistor 52 is turned on. As a result, a high voltage of about 6 volts is applied to the gate insulating film of the anti-fuse element F2 of the memory cell C1 and the gate insulating film is broken down. Therefore, data '11' is written in the memory cell C1.

Figure 17:
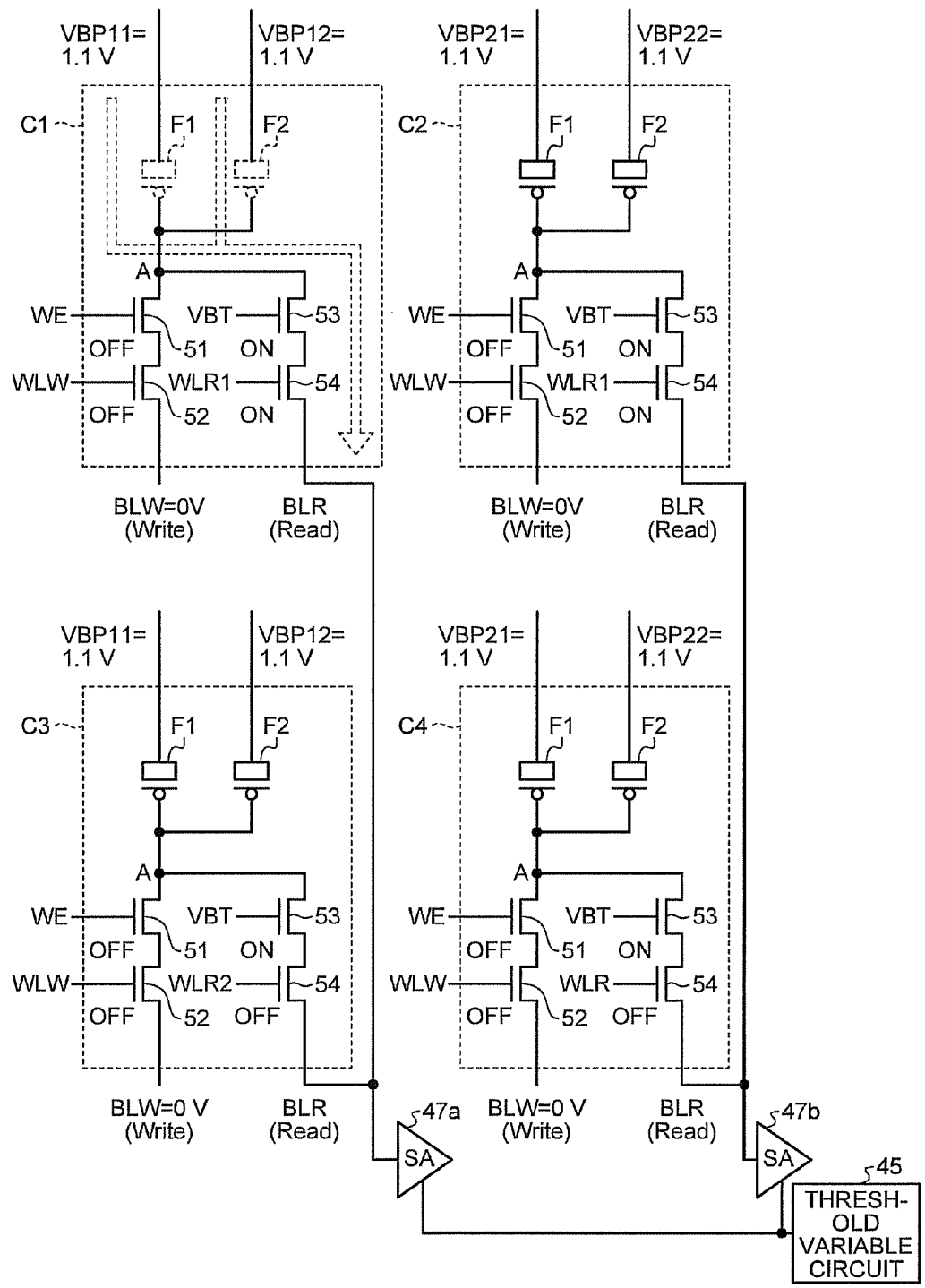
FIG. 17 is a block diagram of a readout operation corresponding to a state shown in FIG. 16.

FIG. 17 is a block diagram of a readout operation corresponding to a state shown in FIG. 16.

In FIG. 17, when data is read out from the memory cell C1, the writing control signal WE is set to low level potential and the writing control transistor 51 is turned off. The program voltages VBP11, VBP12, VBP21, and VBP22 are set to a low voltage (e.g., about 1.1 volts) low enough not to break down the anti-fuse elements F1 and F2. The barrier voltage VBT is applied to the gate of the readout barrier transistor 53 and the readout barrier transistor 53 is turned on. The potential of the writing bit line BLW is set to 0 volt.

When the row addresses RA0 to RAm are input to the row decoder 43, the potential of the readout word line WLR in the selected row rises and the readout transistor 54 in the selected row is turned on. As a result, one ends of the fuse elements F1 and F2 of the memory cell C1 are connected to the sense amplifier 47a in the selected column via the readout barrier transistor 53 and the readout transistor 54.

In the sense amplifier 47a, a voltage read out from the memory cell C1 is compared with thresholds. Data stored in the selected cell is determined according to a difference in the magnitude of a readout current obtained at that point. At this point, a threshold of the sense amplifier 47a is changed to three stages by the threshold variable circuit 45. It is possible to distinguish four levels by determining to which of the stages of the threshold the voltage read out from the memory cell C1 corresponds.

Consequently, it is unnecessary to provide the readout control transistor 51, the writing transistor 52, the readout barrier transistor 53, and the readout transistor 54 for each bit. It is possible to reduce a total number of writing control transistors 51, writing transistors 52, readout barrier transistors 53, and readout transistors 54 per unit capacity. Therefore, it is possible to reduce a layout area.

Eighth Embodiment

Figure 18:
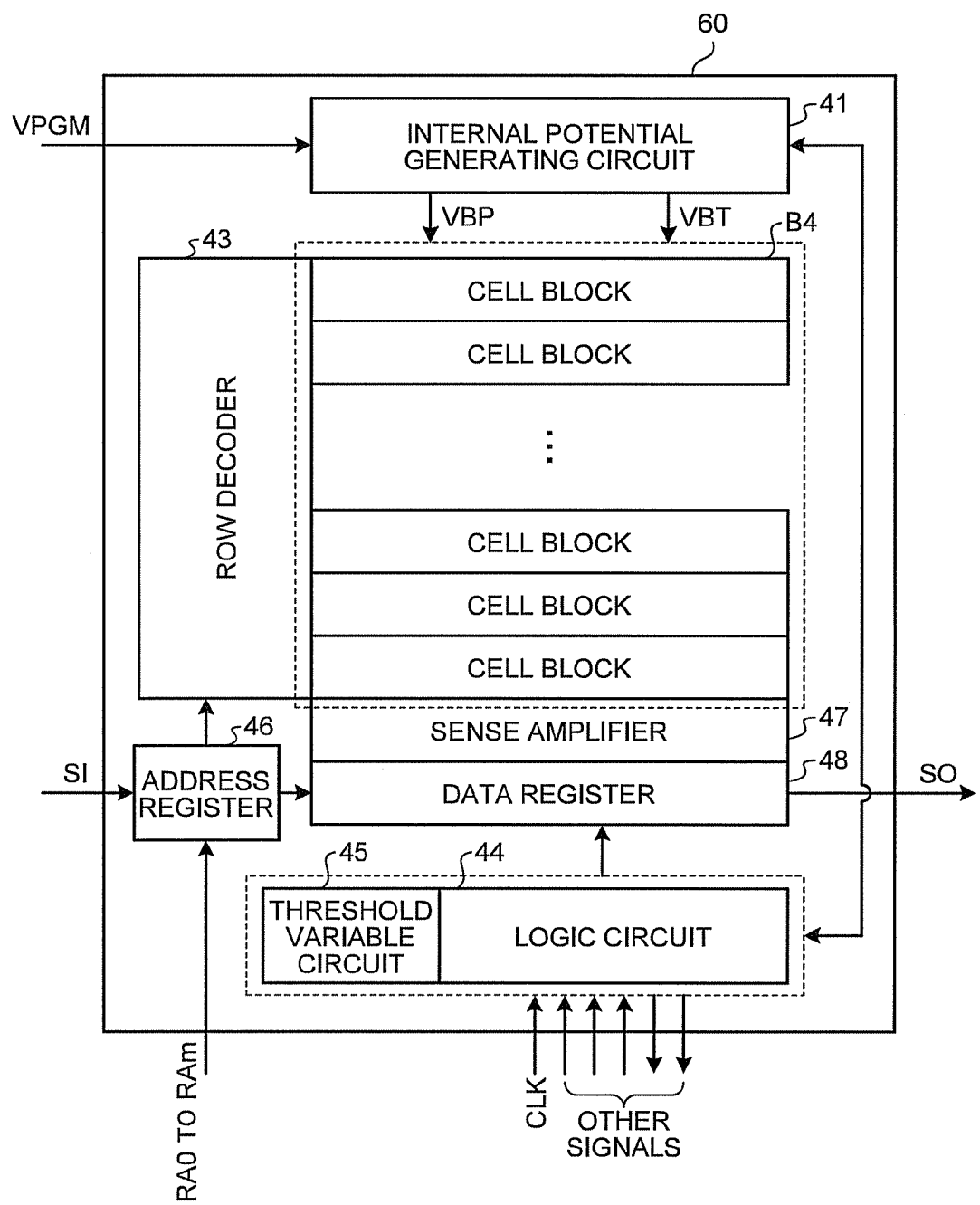
FIG. 18 is a block diagram of a schematic configuration of a nonvolatile semiconductor storage according to an eighth embodiment.

FIG. 18 is a block diagram of a schematic configuration of a nonvolatile semiconductor storage according to an eighth embodiment.

In FIG. 18, a fuse macro block 60 includes cell blocks B4 instead of the cell blocks 53 and the program voltage selection circuit 42 of the fuse macro block 40 shown in FIG. 13. Each of the cell blocks B4 includes memory cells C11 to C14 shown in FIG. 19 instead of the memory cells C1 to C4 shown in FIG. 14.

Figure 19:
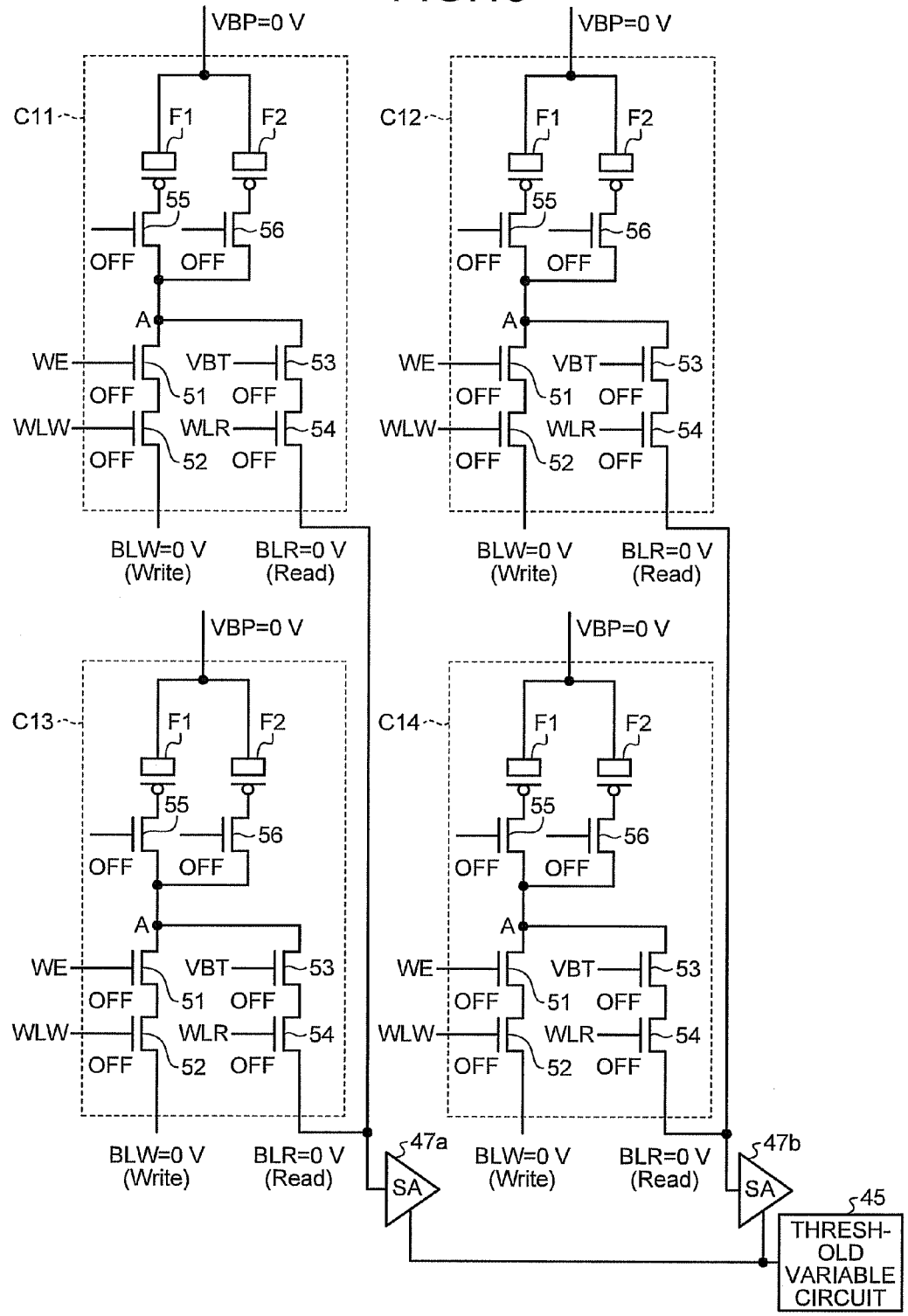
FIG. 19 is a block diagram of an initial state for four cells of the nonvolatile semiconductor storage shown in FIG. 18.

FIG. 19 is a block diagram of an initial state for four cells of the nonvolatile semiconductor storage shown in FIG. 18.

In FIG. 19, in the memory cells C11 to C14, switching transistors 55 and 56 are added to the memory cells C1 to C4 shown in FIG. 14. The switching transistor 55 is connected to the anti-fuse element F1 in series. The switching transistor 56 is connected to the anti-fuse element F2 in series. One ends of the anti-fuse elements F1 and F2 are connected to the node A in common respectively via the switching transistors 55 and 56. The other ends of the anti-fuse elements F1 and F2 are also connected in common. The same program voltage VBP is applied to the anti-fuse elements F1 and F2.

Before the gate insulating films of the field effect transistors of the anti-fuse elements F1 and F2 are broken down, the switching transistors 55 and 56 are turned off. Data '00' is stored in the memory cells C11 to C14. At this point, the program voltage VBP applied to the anti-fuse elements F1 and F2 can be set to 0 volt.

Figure 20:
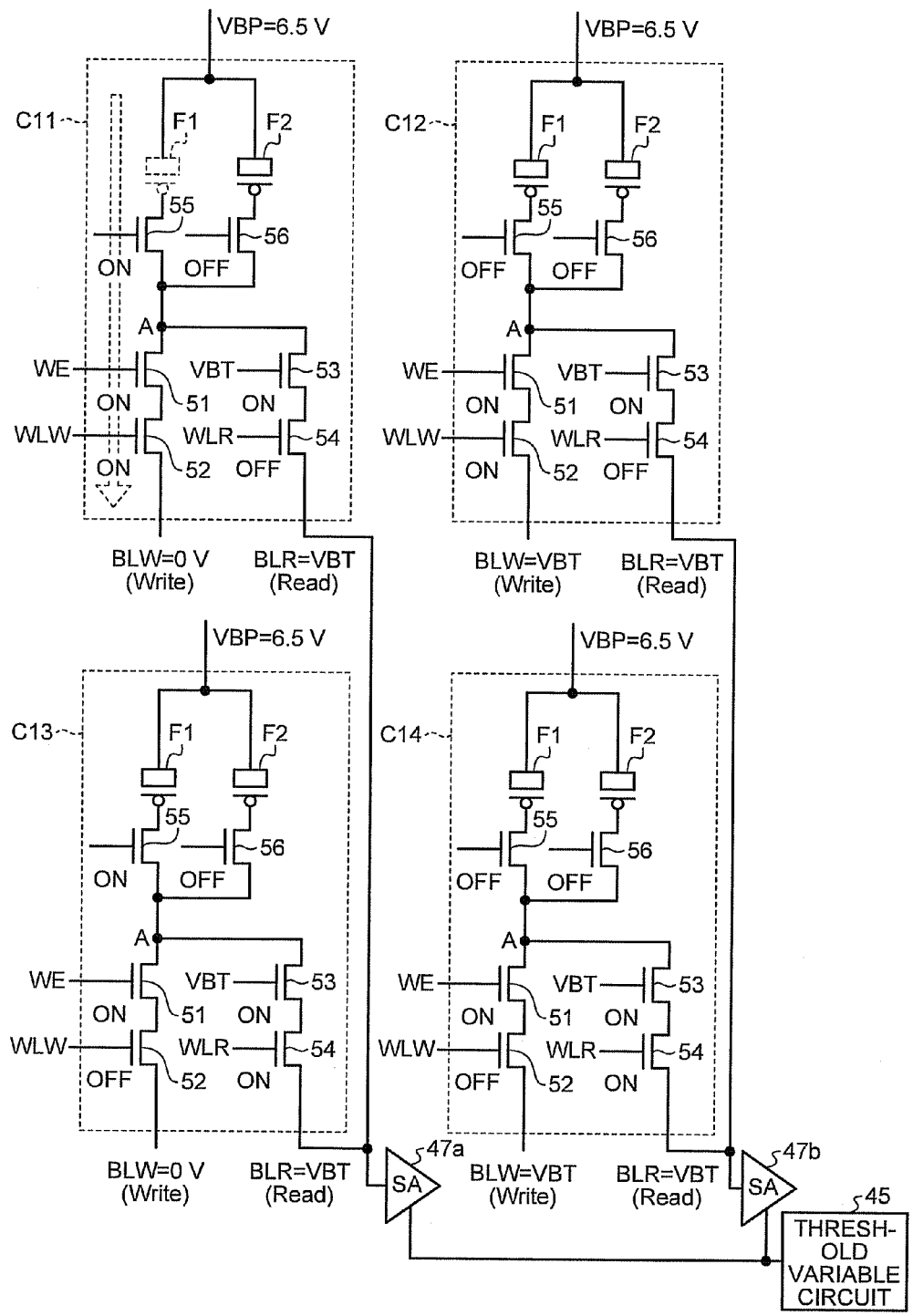
FIG. 20 is a block diagram of a writing operation of the anti-fuse element F1 of a memory cell C11 shown in FIG. 19.

FIG. 20 is a block diagram of a writing operation of the anti-fuse element F1 shown in FIG. 19.

In FIG. 20, when data '10' is written in the memory cell C11, the writing control signal WE is shifted from low level potential to high level potential and the writing control transistor 51 is turned on. The program voltage VBP is set to a high voltage of about 6.5 volts. The barrier voltage VBT is applied to the gate of the readout barrier transistor 53 and the readout barrier transistor 53 is turned on. The potential of the writing bit line BLW in a selected column is set to 0 volt. The potential of the readout bit line BLR in the selected column is set to the barrier voltage VBT. The potential of the writing bit line BLW and the readout bit line BLR in an unselected column is set to the barrier voltage VBT. The switching transistor 55 is turned on and the switching transistor 56 is turned off.

When the row addresses RA0 to RAm are input to the row decoder 43, the potential of the writing word line WLW in a selected row rises and the writing transistor 52 in the selected row is turned on. As a result, a high voltage of about 6 volts is applied to the gate insulating film of the anti-fuse element F1 of the memory cell C11 and the gate insulating film is broken down. Therefore, data '10' is written in the memory cell C11.

Figure 21:
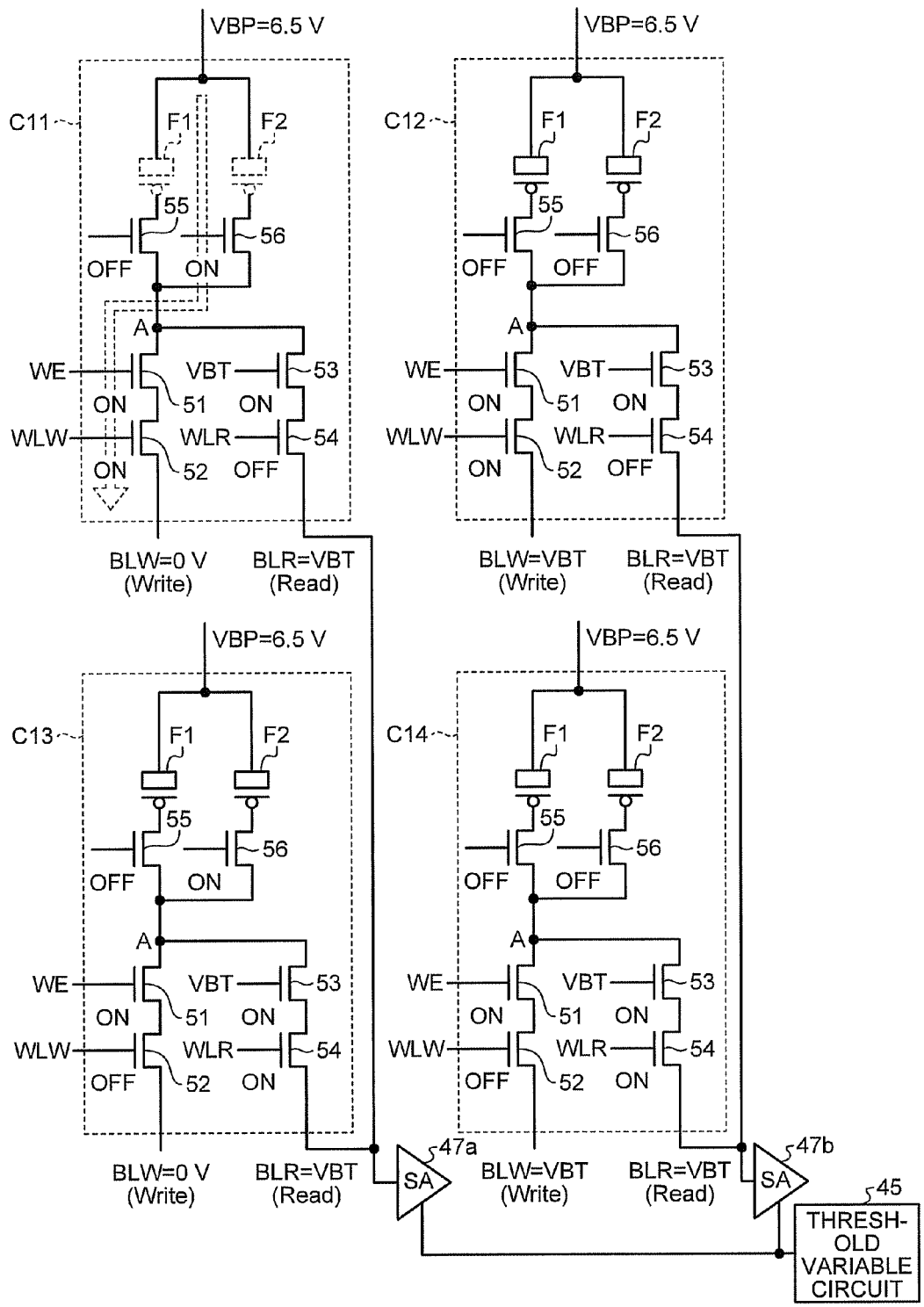
FIG. 21 is a block diagram of a writing operation of the anti-fuse element F2 of the memory cell C11 shown in FIG. 20.

FIG. 21 is a block diagram of a writing operation of the anti-fuse element F2 shown in FIG. 20.

In FIG. 21, when data '11' is written in the memory cell C11, as shown in FIG. 20, the gate insulating film of the anti-fuse element F1 of the memory cell C11 is broken down and then the gate insulating film of the anti-fuse element F2 of the memory cell C11 is broken down.

When the gate insulating film of the anti-fuse element F2 of the memory cell C11 is broken down, the writing control signal WE is shifted from low level potential to high level potential and the writing control transistor 51 is turned on. The program voltage VBP is set to a high voltage of about 6.5 volts. The barrier voltage VBT is applied to the gate of the readout barrier transistor 53 and the readout barrier transistor 53 is turned on. The potential of the writing bit line BLW in the selected column is set to 0 volt. The potential of the readout bit line BLR in the selected column is set to the barrier voltage VBT. The potential of the writing bit line BLW and the readout bit line BLR in the unselected column is set to the barrier voltage VBT. The switching transistor 55 is turned off and the switching transistor 56 is turned on.

When the row addresses RA0 to RAm are input to the row decoder 43, the potential of the writing word line WLW in the selected row rises and the writing transistor 52 in the selected row is turned on. As a result, a high voltage of about 6 volts is applied to the gate insulating film of the anti-fuse element F2 of the memory cell C11 and the gate insulating film is broken down. Therefore, data '11' is written in the memory cell C11.

Figure 22:
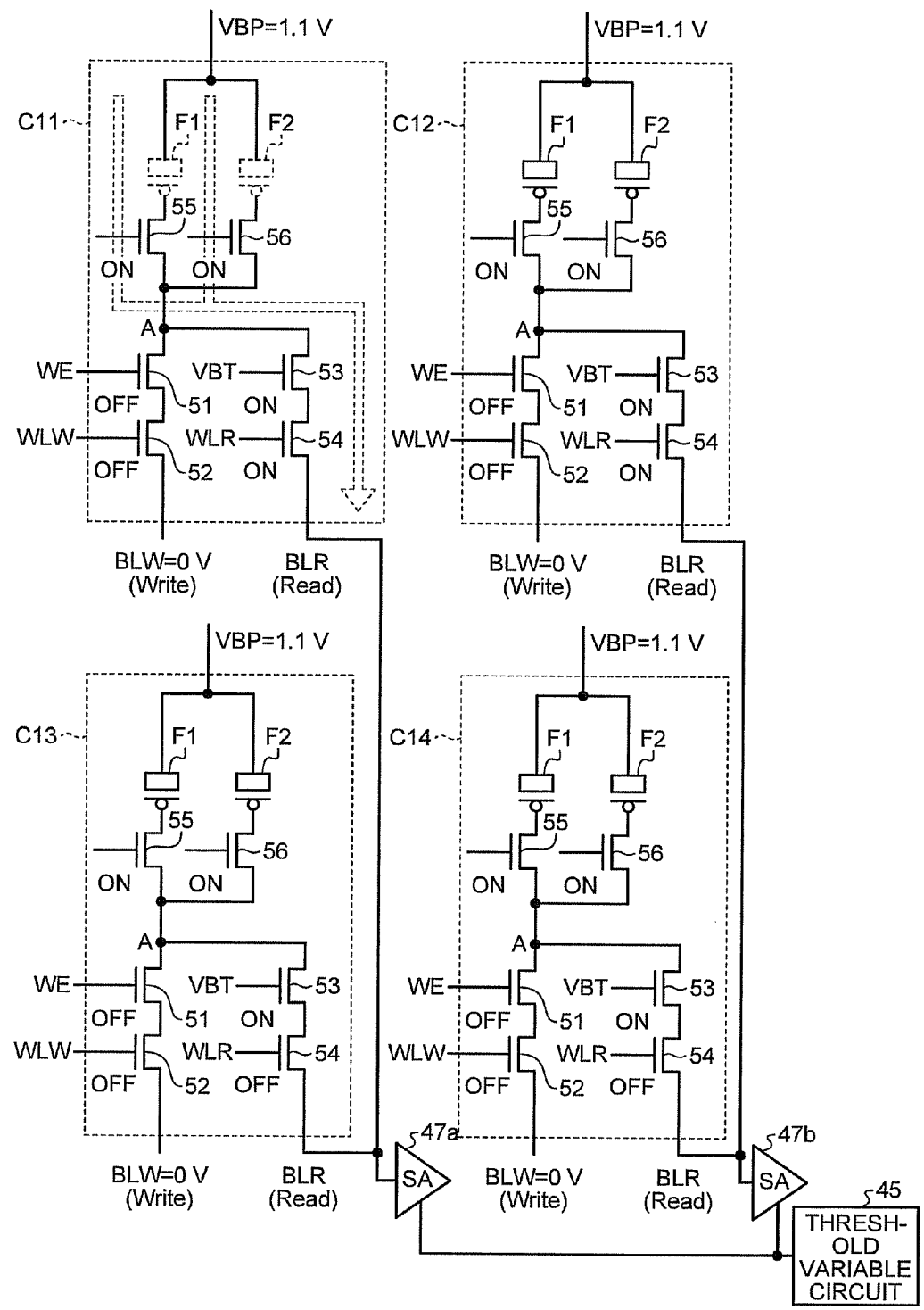
FIG. 22 is a block diagram of a readout operation corresponding to a state shown in FIG. 21.

FIG. 22 is a block diagram of a readout operation corresponding to a state shown in FIG. 21.

In FIG. 22, when data is read out from the memory cell C11, the writing control signal WE is set to low level potential and the writing control transistor 51 is turned off. The program voltage VBP is set to a low voltage (e.g., about 1.1 volts) low enough not to break down the anti-fuse elements F1 and F2. The barrier voltage VBT is applied to the gate of the readout barrier transistor 53 and the readout barrier transistor 53 is turned on. The potential of the writing bit line BLW is set to 0 volt. The switching transistors 55 and 56 are turned on.

When the row addresses RA0 to RAm are input to the row decoder 43, the potential of the readout word line WLR in the selected row rises and the readout transistor 54 in the selected row is turned on. As a result, one ends of the fuse elements F1 and F2 of the memory cell C11 are connected to the sense amplifier 47a in the selected column via the readout barrier transistor 53 and the readout transistor 54.

In the sense amplifier 47a, a voltage read out from the memory cell C11 is compared with thresholds. Data stored in the selected cell is determined according to a difference in the magnitude of a readout current obtained at that point. At this point, a threshold of the sense amplifier 47a is changed to three stages by the threshold variable circuit 45. It is possible to distinguish four levels by determining to which of the stages of the threshold the voltage read out from the memory cell C11 corresponds.

Ninth Embodiment

Figure 23:
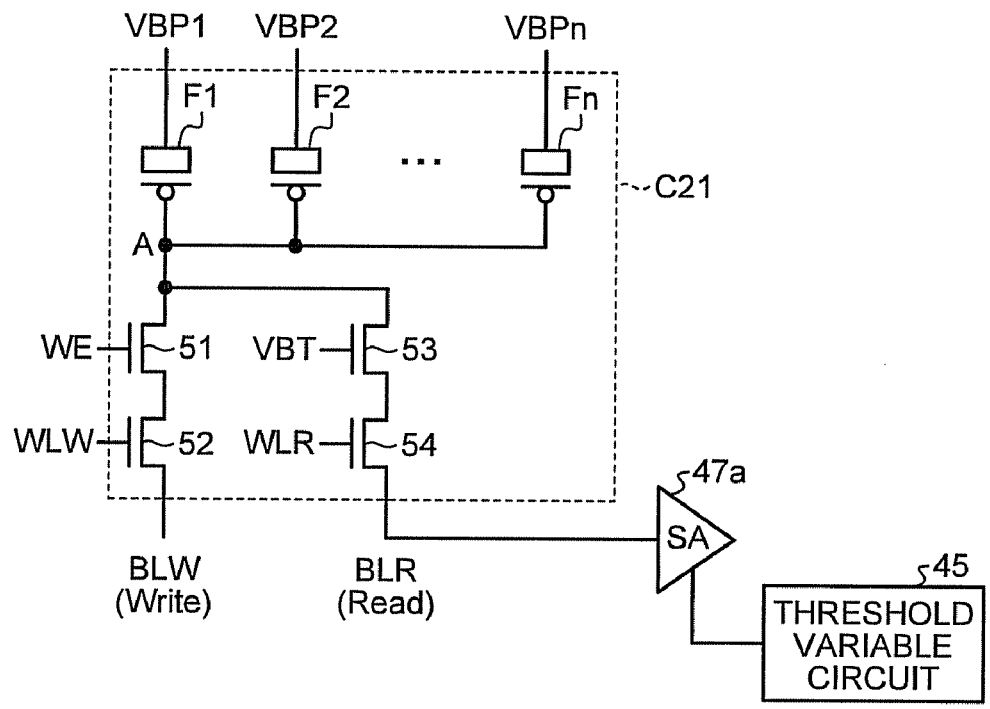
FIG. 23 is a block diagram of a schematic configuration for one cell of a nonvolatile semiconductor storage according to a ninth embodiment.

FIG. 23 is a block diagram of a schematic configuration for one cell of a nonvolatile semiconductor storage according to a ninth embodiment.

In FIG. 23, the nonvolatile semiconductor storage includes a memory cell C21 instead of the memory cell C1 shown in FIG. 14. The memory cell C21 includes n anti-fuse elements F1 to Fn instead of the anti-fuse elements F1 and F2 shown in FIG. 14. The anti-fuse elements F1 to Fn can be configured using field effect transistors. Sources, drains, and wells of the field effect transistors are connected in common. Gates of the field effect transistors of the anti-fuse elements F1 to Fn are connected to one another. Therefore, one ends of the anti-fuse elements F1 to Fn are connected to the node A in common.

Driving forces of the field effect transistors of the anti-fuse elements F2 to Fn can be respectively set to $2^2$ to $2^n$ of driving force of the field effect transistor of the anti-fuse element F1. The threshold variable circuit 25 can change a threshold of the sense amplifier 14 to $(2^n-1)$ stages.

Consequently, the memory cell C21 can be $2^n$-arized. It is possible to reduce a total number of writing control transistors 51, writing transistors 52, readout barrier transistors 53, and readout transistors 54 per unit capacity. Therefore, it is possible to reduce a layout area.

Tenth Embodiment

Figure 24:
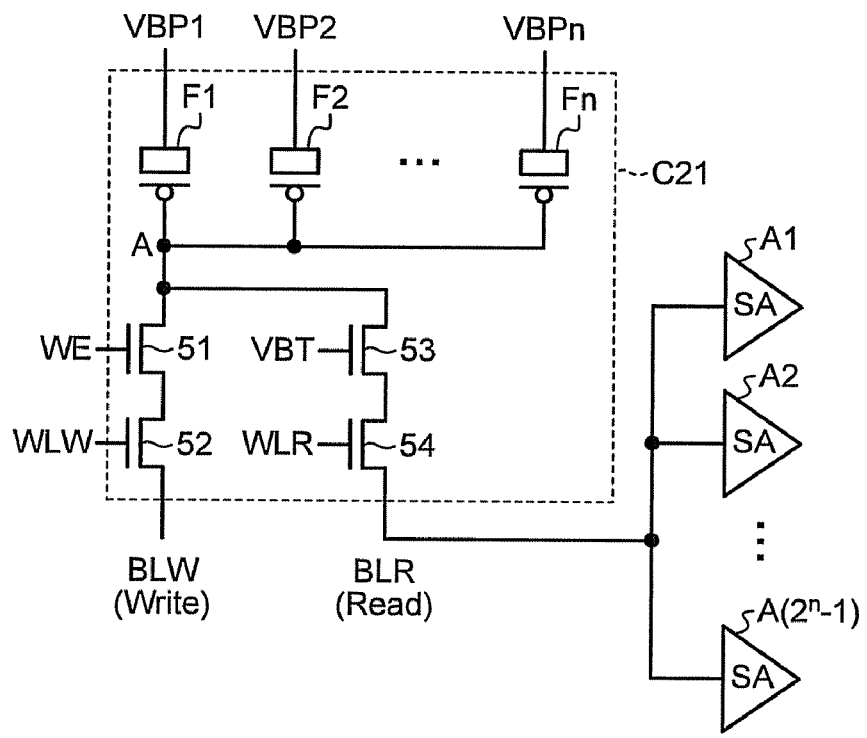
FIG. 24 is a block diagram of a schematic configuration for one cell of a nonvolatile semiconductor storage according to a tenth embodiment.

FIG. 24 is a block diagram of a schematic configuration for one cell of a nonvolatile semiconductor storage according to a tenth embodiment.

In FIG. 24, the nonvolatile semiconductor storage includes $2^n-1$ sense amplifiers A1 to $A(2^n-1)$ instead of the sense amplifier 47a and the threshold variable circuit 45 shown in FIG. 23. A threshold of the sense amplifiers A1 to $A(2^n-1)$ can be changed to $(2^n-1)$ stages.

The sense amplifiers A1 to $A(2^n-1)$ can simultaneously compare potential differences of input terminals thereof and thresholds. Consequently, the memory cell C21 can be $2^n$-arized. It is possible to reduce a layout area. It is unnecessary to repeatedly perform readout from the memory cell C21 to determine data stored in the memory cell C21. Therefore, it is possible to reduce readout time.

Eleventh Embodiment

Figure 25:
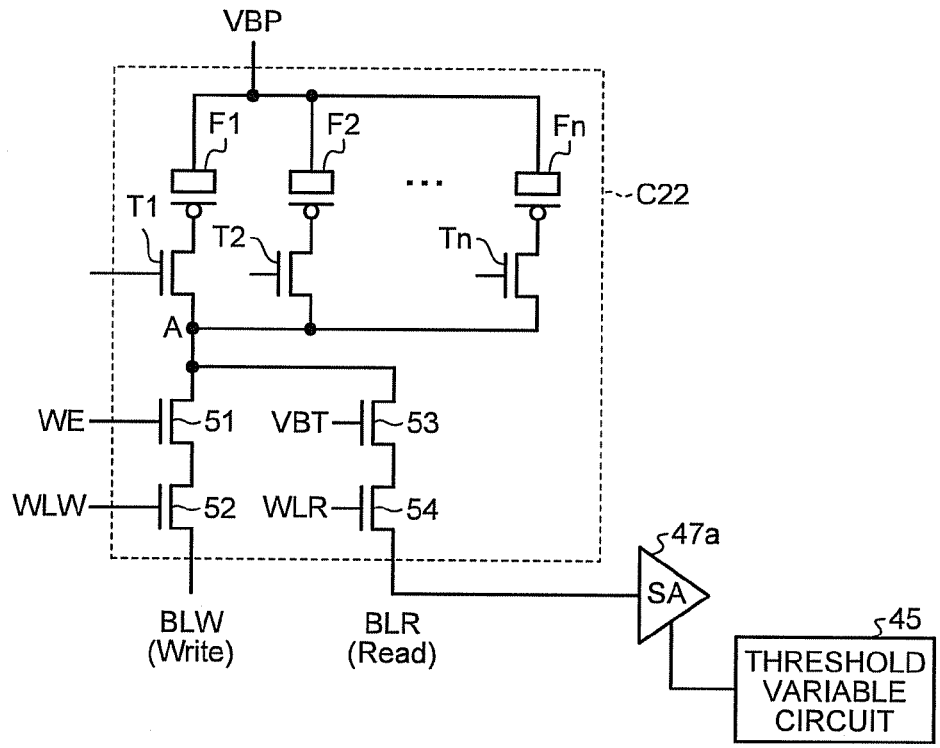
FIG. 25 is a block diagram of a schematic configuration for one cell of a nonvolatile semiconductor storage according to an eleventh embodiment.

FIG. 25 is a block diagram of a schematic configuration for one cell of a nonvolatile semiconductor storage according to an eleventh embodiment.

In FIG. 25, the nonvolatile semiconductor storage includes a memory cell C22 instead of the memory cell C11 shown in FIG. 19. The memory cell C22 includes n anti-fuse elements F1 to Fn and n switching transistors T1 to Tn instead of the anti-fuse elements F1 and F2 and the switching transistors 55 and 56 shown in FIG. 19. The switching transistors T1 to Tn are respectively connected to the anti-fuse elements F1 to Fn in series. One ends of the anti-fuse elements F1 to Fn are connected to the node A in common respectively via the switching transistors T1 to Tn. The other ends of the anti-fuse elements F1 to Fn are also connected in common. The same program voltage VBP is applied to the anti-fuse elements F1 to Fn.

Consequently, the memory cell C22 can be $2^n$-arized. It is possible to reduce a total number of writing control transistors 51, writing transistors 52, readout barrier transistors 53, and readout transistors 54 per unit capacity. Therefore, it is possible to reduce a layout area.

Twelfth Embodiment

Figure 26:
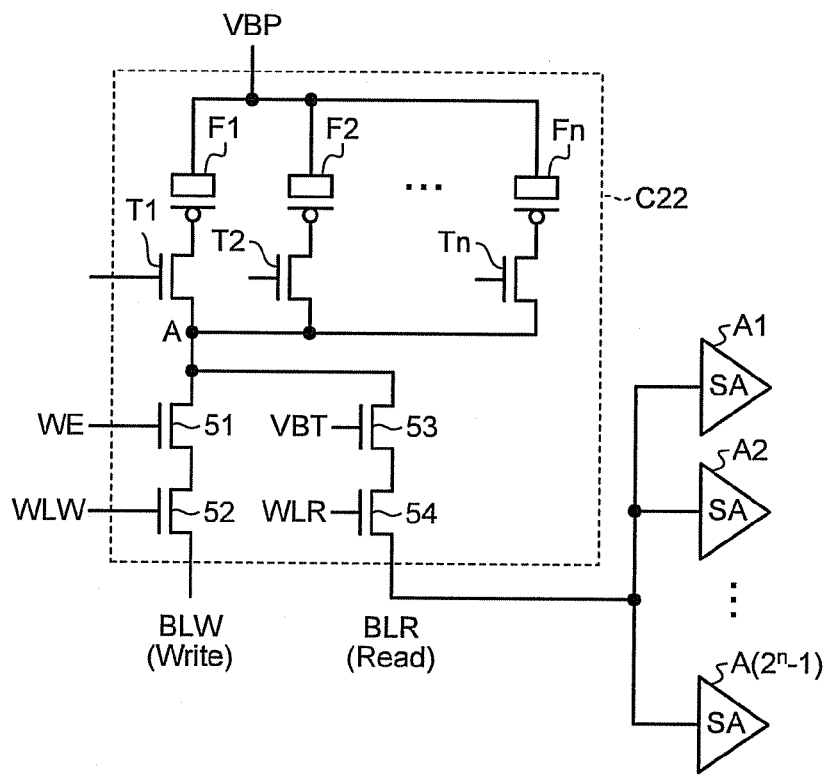
FIG. 26 is a block diagram of a schematic configuration for one cell of a nonvolatile semiconductor storage according to a twelfth embodiment.

FIG. 26 is a block diagram of a schematic configuration for one cell of a nonvolatile semiconductor storage according to a twelfth embodiment.

In FIG. 26, the nonvolatile semiconductor storage includes $2^n-1$ sense amplifiers A1 to $A(2^n-1)$ instead of the sense amplifier 47a and the threshold variable circuit 45 shown in FIG. 25. A threshold of the sense amplifiers A1 to $A(2^n-1)$ can be changed to $(2^n-1)$ stages.

The sense amplifiers A1 to $A(2^n-1)$ can simultaneously compare potential differences of input terminals thereof and thresholds. Consequently, the memory cell C22 can be $2^n$-arized. It is possible to reduce a layout area. It is unnecessary to repeatedly perform readout from the memory cell C22 to determine data stored in the memory cell C22. Therefore, it is possible to reduce readout time.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor storage comprising:
    memory cells, each of which is configured using a field effect transistor and includes n (n is an integer equal to or larger than 2) anti-fuse elements, one ends of which are connected in common;
    an internal potential generating circuit that generates a program voltage for breaking down a gate insulating film of the field effect transistor;
    a program voltage selection circuit that selects, out of the n anti-fuse elements, an anti-fuse element to which the program voltage is applied;
    a sense amplifier that is provided for each of the memory cells and determines, based on data stored in the n anti-fuse elements, three or more readout levels;
    a barrier transistor that is provided for each of the memory cells and protects the sense amplifier from the voltage for breaking down the gate insulating film; and
    a selection transistor that is provided for each of the memory cells and selects a memory cell to which the program voltage is applied.

2. The nonvolatile semiconductor storage of claim 1, wherein transistor sizes or silicide densities of gate electrodes of the field effect transistors of the n anti-fuse elements are different from one another or same one another or field effect transistors having different transistor sizes or silicide densities of gate electrodes and field effect transistors having same transistor sizes or silicide densities of gate electrodes are mixed.

3. The nonvolatile semiconductor storage of claim 1, further comprising a threshold variable circuit that changes a threshold of the sense amplifier according to the three or more readout levels of the memory cell.

4. The nonvolatile semiconductor storage of claim 1, wherein the sense amplifier includes a plurality of sense amplifiers having thresholds different from one another according to the three or more readout levels of the memory cell.

5. The nonvolatile semiconductor storage of claim 1, further comprising:
    a fuse data register that is provided for each of the memory cells and stores data read out by the sense amplifier; and
    a selector that selects the data read out by the sense amplifier or a value stored in a fuse data register at a pre-stage and outputs the data or the value to the fuse data register at an own stage.

6. The nonvolatile semiconductor storage according to claim 1, wherein the program voltage selection circuit is n switching transistors that are connected in series for each of the anti-fuse elements and switch the anti-fuse element to which the program voltage is applied.

7. The nonvolatile semiconductor storage of claim 6, wherein transistor sizes or silicide densities of gate electrodes of the field effect transistors of the n anti-fuse elements are different from one another or same one another or field effect transistors having different transistor sizes or silicide densities of gate electrodes and field effect transistors having same transistor sizes or silicide densities of gate electrodes are mixed.

8. The nonvolatile semiconductor storage of claim 6, further comprising a threshold variable circuit that changes a threshold of the sense amplifier according to the three or more readout levels of the memory cell.

9. The nonvolatile semiconductor storage of claim 6, wherein the sense amplifier includes a plurality of sense amplifiers having thresholds different from one another according to the three or more readout levels of the memory cell.

10. The nonvolatile semiconductor storage of claim 6, further comprising:
a fuse data register that is provided for each of the memory cells and stores data read out by the sense amplifier; and
a selector that selects the data read out by the sense amplifier or a value stored in a fuse data register at a pre-stage and outputs the data or the value to the fuse data register at an own stage.

11. A nonvolatile semiconductor storage comprising:
memory cells, each of which is configured using a field effect transistor and includes n (n is an integer equal to or larger than 2) anti-fuse elements, one ends of which are connected in common;
an internal potential generating circuit that generates a program voltage for breaking down a gate insulating film of the field effect transistor;
a program voltage selection circuit that selects, out of the n anti-fuse elements, an anti-fuse element to which the program voltage is applied;
a sense amplifier that determines, based on data stored in the n anti-fuse elements, three or more readout levels;
a writing transistor that is provided for each of the memory cells and performs writing in the n anti-fuse elements;
a readout transistor that is provided for each of the memory cells and performs readout from the n anti-fuse elements;
a writing control transistor that is provided for each of the memory cells and connected to the writing transistor in series; and
a readout barrier transistor that is provided for each of the memory cells and connected to the readout transistor in series.

12. The nonvolatile semiconductor storage of claim 11, wherein transistor sizes or silicide densities of gate electrodes of the field effect transistors of the n anti-fuse elements are different from one another or same one another or field effect transistors having different transistor sizes or silicide densities of gate electrodes and field effect transistors having same transistor sizes or silicide densities of gate electrodes are mixed.

13. The nonvolatile semiconductor storage of claim 11, further comprising a threshold variable circuit that changes a threshold of the sense amplifier according to the three or more readout levels of the memory cell.

14. The nonvolatile semiconductor storage of claim 11, wherein the sense amplifier includes a plurality of sense amplifiers having thresholds different from one another according to the three or more readout levels of the memory cell.

15. The nonvolatile semiconductor storage of claim 11, wherein
the memory cells are arranged in a matrix shape in a row direction and a column direction, and
the sense amplifier is provided for the each column.

16. A nonvolatile semiconductor storage comprising:
memory cells, each of which is configured using a field effect transistor and includes n (n is an integer equal to or larger than 2) anti-fuse elements, one ends of which are connected in common;
an internal potential generating circuit that generates a program voltage for breaking down a gate insulating film of the field effect transistor;
n switching transistors that are connected in series for each of the anti-fuse elements and switch an anti-fuse element to which the program voltage is applied;
a sense amplifier that determines, based on data stored in the n anti-fuse elements, three or more values of readout levels;
a writing transistor that is provided for each of the memory cells and performs writing in the n anti-fuse elements;
a readout transistor that is provided for each of the memory cells and performs readout from the n anti-fuse elements;
a writing control transistor that is provided for each of the memory cells and connected to the writing transistor in series; and
a readout barrier transistor that is provided for each of the memory cells and connected to the readout transistor in series.

17. The nonvolatile semiconductor storage of claim 16, wherein transistor sizes or silicide densities of gate electrodes of the field effect transistors of the n anti-fuse elements are different from one another or same one another or field effect transistors having different transistor sizes or silicide densities of gate electrodes and field effect transistors having same transistor sizes or silicide densities of gate electrodes are mixed.

18. The nonvolatile semiconductor storage of claim 16, further comprising a threshold variable circuit that changes a threshold of the sense amplifier according to the three or more readout levels of the memory cell.

19. The nonvolatile semiconductor storage of claim 16, wherein the sense amplifier includes a plurality of sense amplifiers having thresholds different from one another according to the three or more readout levels of the memory cell.

20. The nonvolatile semiconductor storage of claim 16, further comprising:
a fuse data register that is provided for each of the memory cells and stores data read out by the sense amplifier; and
a selector that selects the data read out by the sense amplifier or a value stored in a fuse data register at a pre-stage and outputs the data or the value to the fuse data register at an own stage.

* * * * *